United States Patent
Tanaka et al.

(10) Patent No.: US 10,727,424 B2
(45) Date of Patent: Jul. 28, 2020

(54) FLEXIBLE DISPLAY DEVICE

(71) Applicant: Sharp Kabushiki Kaisha, Sakai, Osaka (JP)

(72) Inventors: Tetsunori Tanaka, Sakai (JP); Takeshi Yaneda, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 155 days.

(21) Appl. No.: 16/070,295

(22) PCT Filed: Apr. 27, 2017

(86) PCT No.: PCT/JP2017/016695
§ 371 (c)(1),
(2) Date: Jul. 16, 2018

(87) PCT Pub. No.: WO2018/198262
PCT Pub. Date: Nov. 1, 2018

(65) Prior Publication Data
US 2019/0363267 A1 Nov. 28, 2019

(51) Int. Cl.
*H01L 51/00* (2006.01)
*H01L 27/32* (2006.01)
*H01L 51/52* (2006.01)
*H05K 1/02* (2006.01)

(52) U.S. Cl.
CPC ...... *H01L 51/0097* (2013.01); *H01L 27/3276* (2013.01); *H01L 51/524* (2013.01); *H05K 1/028* (2013.01); *H01L 2251/5338* (2013.01)

(58) Field of Classification Search
CPC ........ H01L 51/0097; H01L 2251/5338; H05K 1/028
See application file for complete search history.

(56) References Cited

U.S. PATENT DOCUMENTS

| 2013/0248867 | A1 | 9/2013 | Kim et al. | |
| 2015/0060778 | A1 | 3/2015 | Kim et al. | |
| 2015/0179728 | A1 | 6/2015 | Kwon et al. | |
| 2015/0233557 | A1 | 8/2015 | Aoyama et al. | |
| 2017/0033312 | A1* | 2/2017 | Kim | H01L 27/3276 |
| 2017/0279057 | A1* | 9/2017 | Park | H01L 27/3218 |
| 2018/0294328 | A1* | 10/2018 | Kanaya | H01L 27/3276 |

FOREIGN PATENT DOCUMENTS

| JP | 2004-95551 A | 3/2004 |
| JP | 2011-22528 A | 2/2011 |
| JP | 2012-3989 A | 1/2012 |
| JP | 2012-169139 A | 9/2012 |
| JP | 2015-50181 A | 3/2015 |
| JP | 2015-166862 A | 9/2015 |
| JP | 2016-224118 A | 12/2016 |

OTHER PUBLICATIONS

Official Communication issued in International Patent Application No. PCT/JP2017/016695, dated Jul. 25, 2017.

* cited by examiner

*Primary Examiner* — Matthew C Landau
*Assistant Examiner* — Mark Hatzilambrou
(74) *Attorney, Agent, or Firm* — Keating & Bennett, LLP

(57) ABSTRACT

A flexible display device has, in a folding portion, a slit that partitions a second electrode provided in common for a plurality of pixels, between a plurality of display units. In a plan view, in the slit, at least one of an organic insulating film, banks, and an organic layer has a slit, and a bulging portion formed by the organic insulating film and the banks is provided so as to surround each of the partitioned second electrodes.

20 Claims, 11 Drawing Sheets

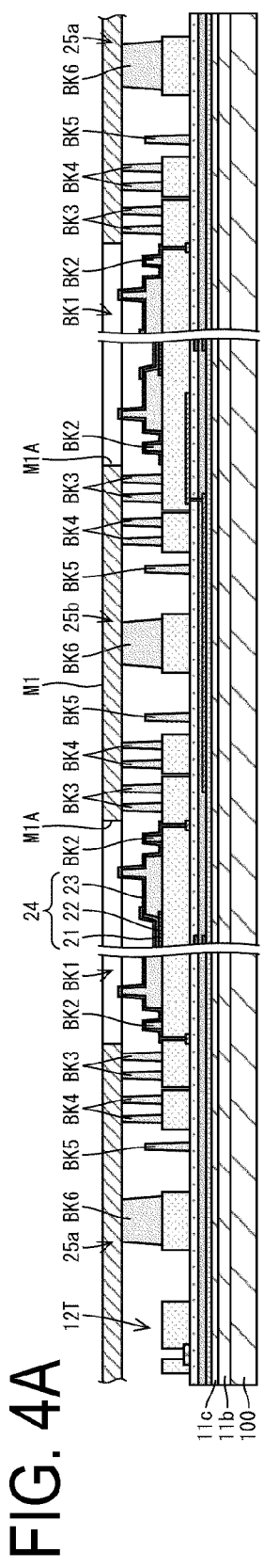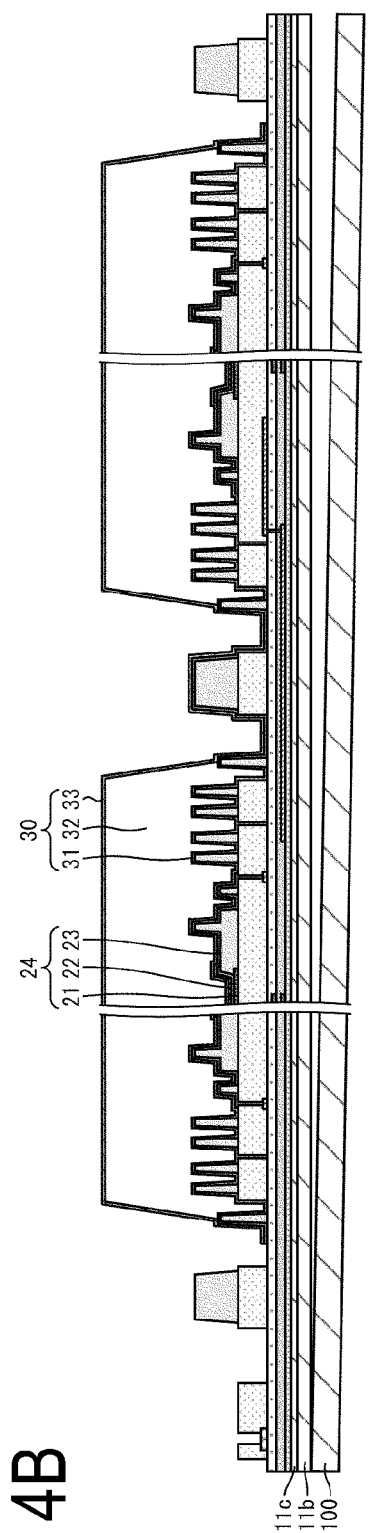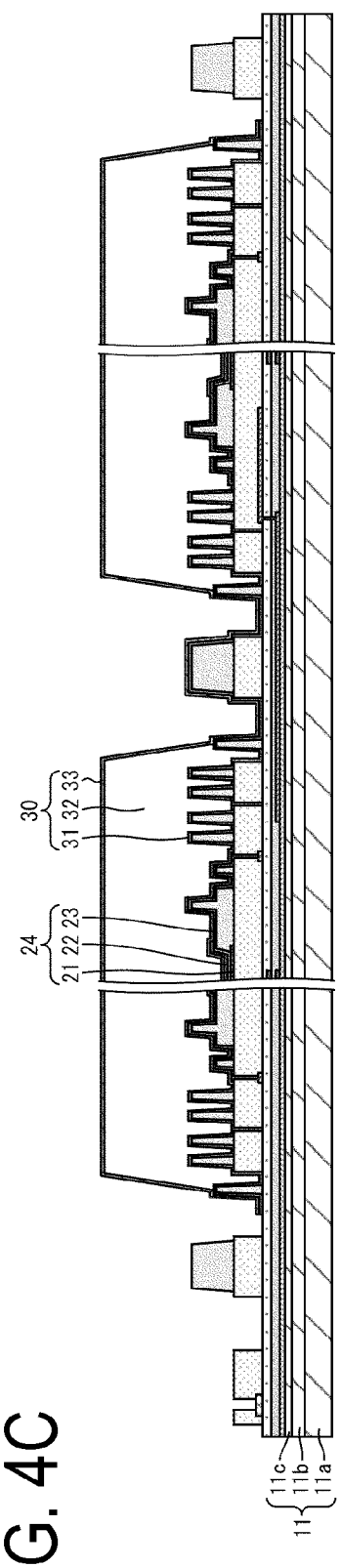

FLEXIBLE DISPLAY DEVICE

TECHNICAL FIELD

The disclosure relates to a flexible display device.

BACKGROUND ART

A flexible display device has a configuration in which electro-optical elements are sandwiched, along with circuits that drive the electro-optical elements, other circuits and the like, between a support body that supports these circuits and various functional layers.

The flexible display device is used as a foldable display device that has a flexibly deformable display portion, that is thin and light, and that is bendable.

The above-described electro-optical element includes, for example, an EL element, which is an optical element that utilizes the electroluminescence (hereinafter referred to as EL) of a luminescent material. An EL display device using the EL element is attracting attention as a display device having a faster response speed and a wider viewing angle than a liquid crystal display device.

However, this type of optical element is typically susceptible to the influence of moisture, oxygen and the like, and when a reaction occurs with small amounts of moisture or oxygen, the characteristics thereof are degraded, and reliability deteriorates, thus resulting in a reduced lifetime of the display device.

As a method to suppress the infiltration of moisture and oxygen into the optical element, a method is known in which the optical element is sealed by a sealing film that includes an organic layer.

For example, in PTL 1, a thin film encapsulation (TFE) technology is disclosed in which the above-described optical element is sealed by forming a sealing film, in which inorganic layers (inorganic sealing layers) and organic layers (organic sealing layers) are alternately layered, on the optical element.

Further, in PTL 2, a solid sealed type organic electroluminescent panel is disclosed that is produced by forming, as a stopper pattern that stops the flow of a liquid resin, a plurality of protrusions, which are formed by patterning an insulating layer, in order to configure a bank that partitions a light emitting layer, thus sealing an organic film including the light emitting layer using the resin (an organic sealing layer). Note that in PTL 2, in order to improve the quality of the solid sealing, it is disclosed that a layer of an inorganic material may also be formed on the layer formed of the above-described resin.

CITATION LIST

Patent Literature

PTL 1: JP 2004-95551 A (published on Mar. 25, 2004).
PTL 1: JP 2012-3989 A (published on Jan. 5, 2012).

SUMMARY

Technical Problem

However, in the flexible display device, when a thick organic layer, such as the organic sealing layer or the protrusions as in PTL 1 and 2, is provided, it becomes difficult to fold the flexible display device. Further, since the foldable flexible display device is used while folded, stress is easily concentrated at a folding portion. Thus, in the flexible display device, when a thick organic layer, such as the organic sealing layer or the protrusions as in PTL 1 and 2, is provided, stress becomes large in the folding portion, and cracks tends to be generated in the folding portion.

In light of the above-described problems, an object of the disclosure is to provide a flexible display device capable of being easily folded at a folding portion and capable of reducing stress acting on the folding portion.

Solution to Problem

In order to solve the above-described problems, a flexible display device according to a first aspect of the disclosure includes a plurality of display units provided on either side of a folding portion, the display unit including a plurality of light emitting elements and each light emitting element including a first electrode provided for each of pixels, a functional layer including at least a light emitting layer, and a second electrode provided in common for the plurality of pixels. A semiconductor layer, a layered film, which includes a plurality of inorganic insulating layers and a plurality of wiring layers and in which the inorganic insulating layers and the wiring layers are repeatedly layered, a flattening film that levels the surface of the layered film, banks that respectively cover the plurality of first electrodes provided for each of the pixels and peripheral portions of the plurality of first electrodes, the functional layer, the second electrode, and a sealing film which is larger, in a plan view, than the second electrode and which seals the plurality of light emitting elements, are layered in this order. The sealing film includes an inorganic sealing layer and an organic sealing layer, and the second electrode includes a slit, in the folding portion, that partitions the second electrode between the plurality of display units. In a plan view, inside the slit of the second electrode in the folding portion, at least one of the flattening film, the banks, and the organic sealing layer includes a slit, and a bulging portion is provided that is formed by the flattening film and the banks and that surrounds each of the second electrodes partitioned by the slit provided in the second electrode.

Advantageous Effects of Disclosure

A flexible display device capable of reducing stress can be provided.

BRIEF DESCRIPTION OF DRAWINGS

FIGS. 4A to 4C are cross-sectional views illustrating a sequence of processes of a process for producing the main portions of the flexible display device according to the first embodiment of the disclosure.

DESCRIPTION OF EMBODIMENTS

A detailed description follows regarding embodiments of the disclosure.

First Embodiment

A description follows regarding a first embodiment of the disclosure, with reference to FIG. 1 to FIG. 5.

Note that, in the following description, the description is made taking as an example a case in which a flexible display device according to the present embodiment is an organic EL display device provided with an organic light emitting diode (OLED) layer including OLED elements, referred to as organic EL elements, as light emitting elements (optical elements).

Schematic Configuration of Flexible Display Device

Figure 1:
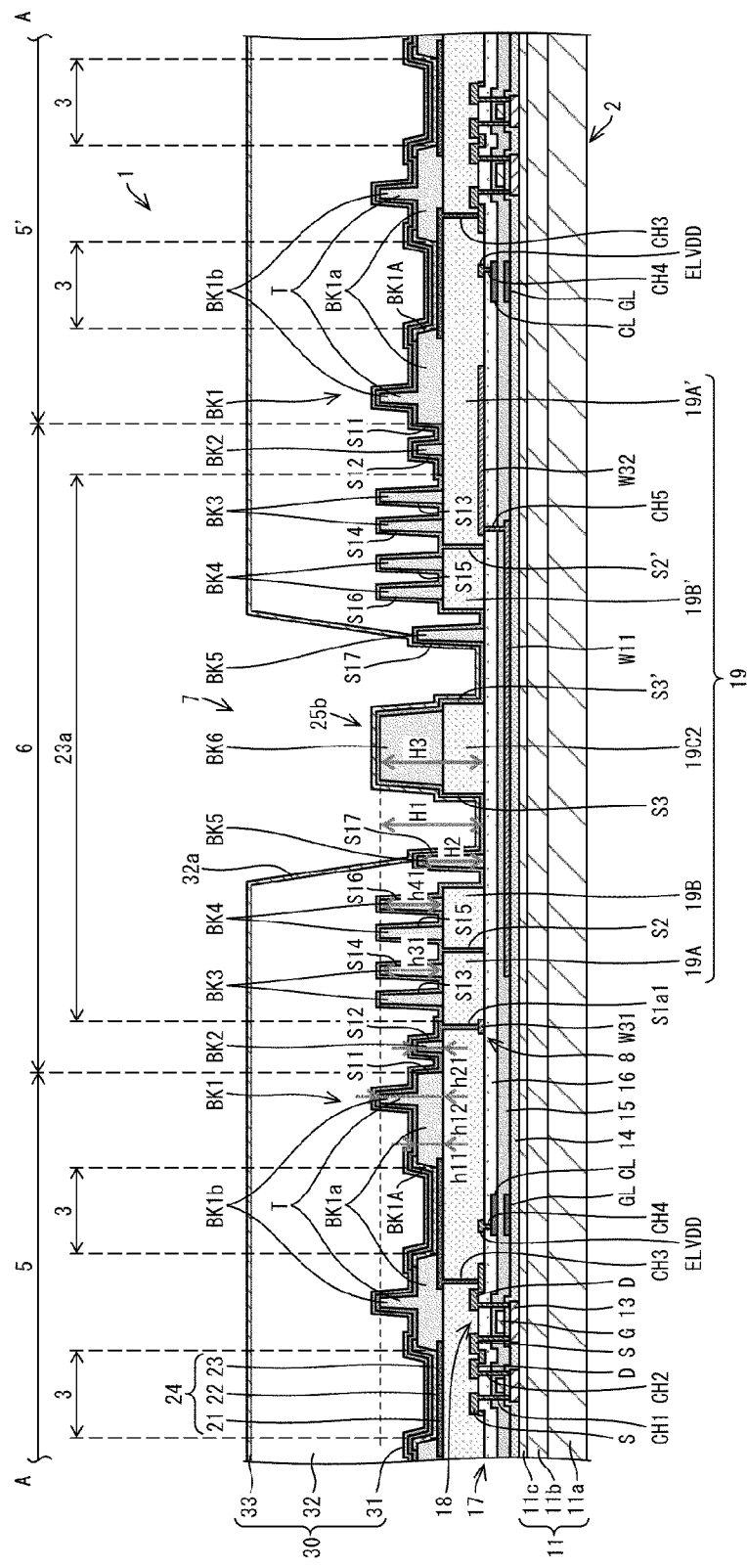
FIG. 1 is a cross-sectional view illustrating a schematic configuration around a folding portion of a flexible display device according to a first embodiment of the disclosure.
Figure 2:
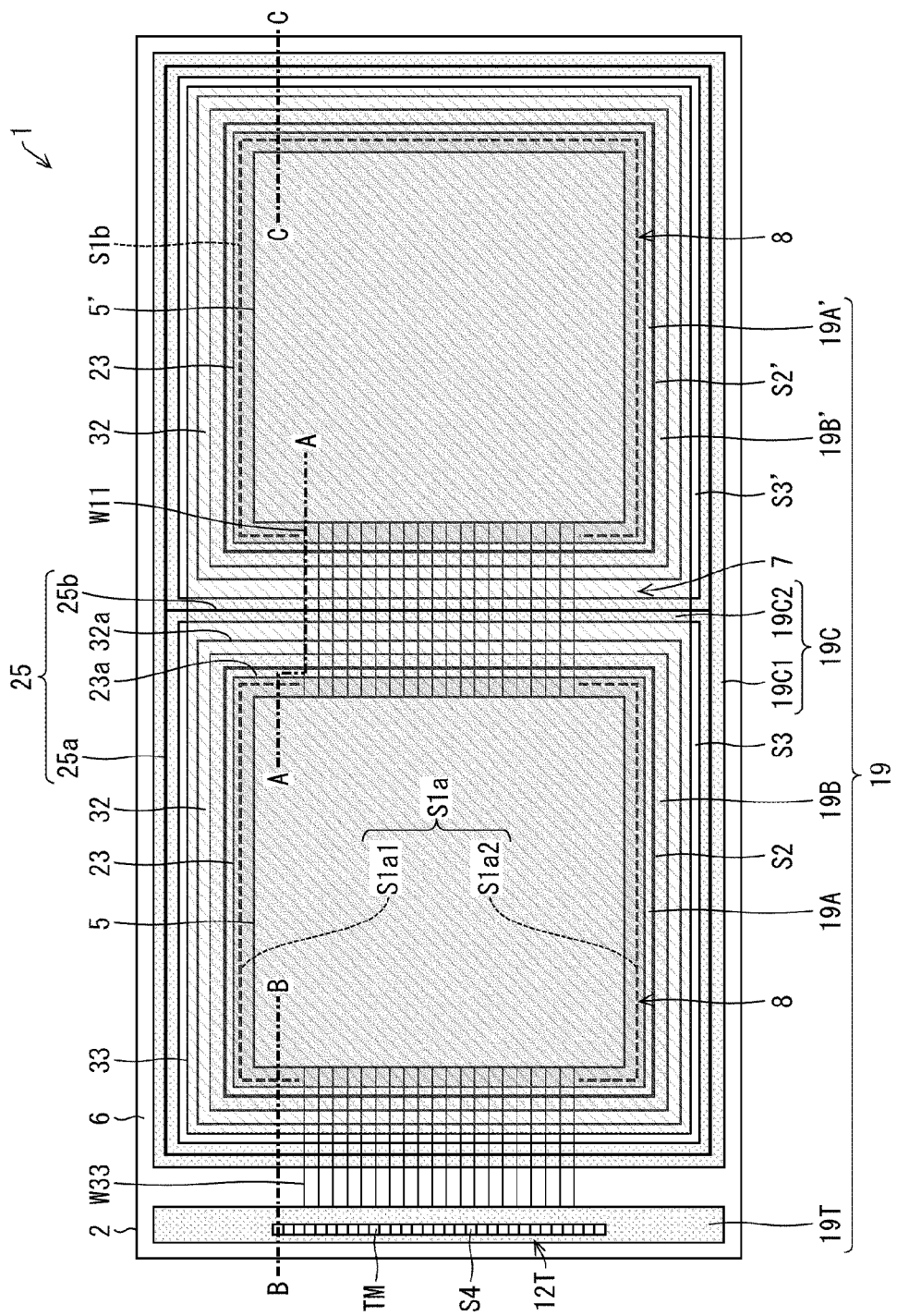
FIG. 2 is a plan view illustrating a schematic configuration of main portions of the flexible display device according to the first embodiment of the disclosure.
Figure 3:
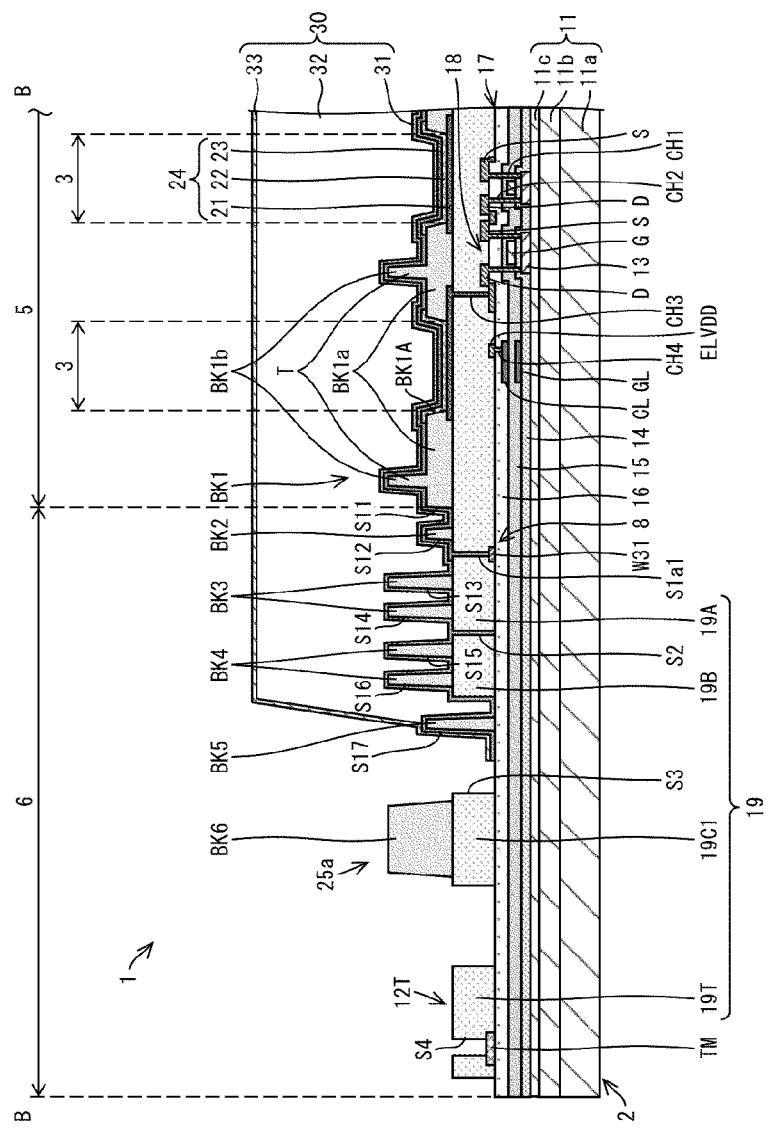
FIG. 3 is a cross-sectional view illustrating a schematic configuration around a terminal portion of the flexible display device according to the first embodiment of the disclosure.

FIG. 1 is a cross-sectional view illustrating a schematic configuration around a folding portion 7 of a flexible display device 1 according to the present embodiment. FIG. 2 is a plan view illustrating a schematic configuration of main portions of the flexible display device 1 according to the present embodiment. FIG. 3 is a cross-sectional view illustrating a schematic configuration around a terminal portion 12T of the flexible display device 1 according to the present embodiment.

Note that FIG. 1 corresponds to a cross-sectional view along a line A-A of the flexible display device 1 illustrated in FIG. 2. FIG. 3 corresponds to a cross-sectional view along a line B-B of the flexible display device 1 illustrated in FIG. 2.

The flexible display device 1 according to the present embodiment is a foldable flexible image display device (foldable display) that is provided so as to be foldable (bendable) and deployable.

Here, a deployed state is a state in which the flexible display device 1 has been deployed to 180 degrees. Specifically, the flexible display device 1 is flat as a result of being opened, namely, is in a so-called fully flat state.

Hereinafter, a description will be made taking as an example a case in which the above-described flexible display device 1 is a single-fold rectangular shaped display device.

The flexible display device 1 according to the present embodiment is provided with an OLED panel 2 illustrated in FIG. 1 to FIG. 3 and with a drive circuit (not illustrated) and the like.

As illustrated in FIG. 1 to FIG. 3, in a plan view, the above-described flexible display device 1 includes a plurality of display units (display units 5 and 5', for example) that display an image, and a frame region 6, which is a peripheral region (non-display region) surrounding the periphery of each of the display units 5 and 5'. Further, a folding portion 7 is provided in the frame region 6 between the above-described plurality of display units 5. Here, the plan view illustrates a view when the OLED panel 2 is seen from an upper face side thereof, for example.

The flexible display device 1 illustrated in FIG. 1 and FIG. 2 is the single-fold rectangular shaped display device. Thus, in FIG. 2, an example is illustrated of a case in which the flexible display device 1 has the two display units 5 and 5' configuring two screens of a two-page spread.

The single folding portion 7 is provided along the lateral direction of the above-described flexible display device 1, so as to link central portions of each side along the longitudinal direction of the flexible display device 1. The folding portion 7 bisects (namely, divides into two equal parts) each of the sides along the longitudinal direction of the flexible display device 1.

The OLED panel 2 has a configuration in which an OLED layer 20 that configures organic EL elements (OLED elements) 24, a sealing film 30, and a cover body (not illustrated) are provided on a Thin Film Transistor (TFT) substrate 10, in the above order from the TFT substrate 10 side.

TFT Substrate 10

The TFT substrate 10 is provided with an insulating support body 11, and a TFT layer 12 provided on the support body 11.

Support Body 11

As illustrated in FIG. 1 and FIG. 2, the support body 11 is a flexible layered film provided with a resin layer 11b, a barrier layer 11c (a moisture barrier layer) provided on the resin layer 11b, and a lower face film 11a, which is provided on an opposite side surface of the resin layer 11b to the barrier layer 11c, using an adhesive layer (not illustrated).

Note that, hereinafter, the description is made in which the side of the lower face film 11a of the support body 11 is the lower side, and the cover body side is the upper side.

The resin used in the above-described resin layer 11b is, for example, a polyimide, polyethylene, a polyamide or the like.

The barrier layer 11c is a layer to prevent moisture or impurities from reaching the TFT layer 12 and the OLED layer 20 formed on the support body 11, and can be formed, for example, from a silicon oxide (SiOx) film, a silicon nitride (SiNx) film, a layered film of these, or the like.

The barrier layer 11c is provided across an entire surface of the resin layer 11b, such that the surface of the resin layer 11b is not exposed. In this way, even in a case where a resin that is not resistant to liquid chemicals, such as a polyimide or the like, is used as the resin layer 11b, elution of the above-described resin by liquid chemicals and process contamination can be suppressed.

By adhering the lower face film 11a to the lower face of the resin layer 11b that has been peeled off from a carrier substrate, such as a glass substrate, used in the production of the OLED panel 2, even when the resin layer 11b is extremely thin, the flexible display device 1 having sufficient strength can be produced. A plastic film made from a flexible resin, such as polyethylene terephthalate, polyethylene napthalate, a cycloolefin polymer, a polyimide, polycarbonate, polyethylene, an aramid or the like is used as the lower face film 11a, for example.

TFT Layer 12

As illustrated in FIG. 1 and FIG. 3, the TFT layer 12 has a configuration in which a semiconductor layer 13, a layered film 17 in which inorganic insulating layers and wiring layers are repeatedly layered (hereinafter referred to simply as a "layered film 17"), and an organic insulating film 19 that is used as a flattening film to level the surface of the above-described layered film 17 are provided, in the above order, from the bottom (namely, from the support body 11 side).

The semiconductor layer 13 is formed in a plurality of island shapes. The layered film 17 includes the plurality of inorganic insulating layers and the plurality of wiring layers, and has the configuration in which the inorganic insulating layers and the wiring layers are alternately layered in a plurality of layers. As illustrated in FIG. 1 and FIG. 3, for example, the above-described inorganic insulating layers and the above-described wiring layers are repeatedly alternately layered in the above order from the bottom.

The inorganic insulating layers include a gate insulating film 14, and inorganic insulating films 15 and 16 (first and second passivation films). The wiring layers include a first metal layer, a second metal layer, and a third metal layer. Further, as illustrated in FIG. 3, a plurality of terminals TM for connecting to the outside are formed on the terminal portion 12T formed on the end portion of the TFT layer 12. The OLED layer 20 and the sealing film 30 are not formed on the terminal portion 12T, but edges of the terminals TM are covered by the organic insulating film 19.

As illustrated in FIG. 1, the first metal layer includes a plurality of gate electrodes G, a plurality of gate lines GL connected to the plurality of gate electrodes G, a plurality of lines W11 that electrically connect the plurality of display units (the display units 5 and 5' in the present embodiment), and a plurality of emission lines (not illustrated). The second metal layer includes a plurality of capacity wiring lines CL. The third metal layer includes a plurality of source electrodes S, a plurality of source lines (not illustrated) that are connected to the plurality of source electrodes S, a plurality of drain electrodes D, a plurality of lines W31 that are connected to second electrodes 23 of the organic EL elements 24, a plurality of lines W32 that are connected to each of the lines W11, a plurality of lines W33 (see FIG. 2) that are connected to each of the terminals TM, a plurality of high level power source lines ELVDD, and a plurality of low level power source lines ELVSS (not illustrated). Note that, in the present embodiment, the high level power source lines are denoted by the same reference sign ELVDD as a high level power source potential, and the low level power source lines (not illustrated) are denoted by the same reference sign ELVSS as a low level power source potential.

The gate insulating film 14 is formed on the support body 11 so as to cover the semiconductor layer 13 formed on the support body 11. The first metal layer is formed on the gate insulating film 14. The first metal layer is covered by an inorganic insulating film 15 (the first passivation film) and the second metal layer is formed on the inorganic insulating film 15. Further, an inorganic insulating film 16 (the second passivation film) is formed on the inorganic insulating film 15 so as to cover the second metal layer, and the third metal layer is formed on the inorganic insulating film 16. Note that an inorganic insulating film (not illustrated) may be provided as a third passivation film, on the above-described third metal layer.

The semiconductor layer 13, the gate electrodes G, the inorganic insulating films 15 and 16, the source electrodes S and the drain electrodes D configure a TFT 18.

The source electrodes S are connected to the semiconductor layer 13 via a contact hole CH1 provided in the gate insulating film 14 and the inorganic insulating films 15 and 16. The drain electrodes D are connected to the semiconductor layer 13 via a contact hole CH2 provided in the gate insulating film 14 and the inorganic insulating films 15 and 16.

Further, the source electrodes S are connected to source lines SL. The drain electrodes D are connected to first electrodes 21 of the organic EL elements 24 via a contact hole CH3 that penetrates the organic insulating film 19. The capacity wiring lines CL are connected to the high level power source lines ELVDD via a contact hole CH4 provided in the inorganic insulating film 16. The high level power source lines ELVDD are wired parallel to source lines (not illustrated). Although not illustrated, the low level power source lines ELVSS are wired parallel to the gate lines GL.

The high level power source lines ELVDD are connected to a high level power source circuit part (not illustrated). The low level power source lines ELVSS are connected to a low level power source circuit part (not illustrated).

A voltage of the high level potential ELVDD, which is a higher potential than the voltage of the low level potential ELVSS applied to the second electrodes 23 (negative electrodes) of the organic EL elements 24, is applied to the first electrodes 21 (positive electrodes) of each of the organic EL elements 24, in order to supply a drive current (light emission current) in accordance with display data.

The high level power source lines ELVDD supply the high level potential ELVDD, supplied from the high level power source circuit part, to each of the organic EL elements 24. The low level power source lines ELVSS supply the low level potential ELVSS, supplied from the low level power source circuit part, to each of the organic EL elements 24. Note that the high level potential ELVDD and the low level potential ELVSS are each a fixed potential.

The emission lines (light emission control lines) are respectively provided parallel to each of the gate lines GL. The emission lines control the timing of light emission/non-emission of each of the organic EL elements 24.

Moreover, each of the gate lines GL and each of the emission lines are respectively connected to a gate driver (not illustrated), and the source lines SL are connected to a source driver (not illustrated).

The gate driver drives each of the gate lines GL and each of the emission lines on the basis of a control signal, such as a clock signal, received from a display control circuit part (not illustrated). The source driver is connected to each of the source lines SL and drives each of the source lines SL.

The lines W11 are connected to the lines W32 via a contact hole CH5 provided in the inorganic insulating films 15 and 16.

As illustrated in FIG. 1 and FIG. 3, in the present embodiment, the gate insulating film 14 and the inorganic insulating films 15 and 16 are provided over the whole surface of the support body 11, so as to extend over the plurality of display units (the display units 5 and 5', for example), in a plan view. Thus, in the present embodiment, the gate insulating film 14 and the inorganic insulating films 15 and 16 are provided on the folding portion 7.

When the inorganic insulating layers are provided on the folding portion 7 in this way, the lines in the same layer as the gate electrodes G or the capacity wiring lines CL (specifically, the first metal layer or the second metal layer)

can be used as the lines to electrically connect the plurality of display units (in other words, to connect the adjacent display units 5 and 5'). Thus, in FIG. 1, the example is illustrated of the case in which the lines W11 are formed in the first metal layer, but the lines W11 may be formed in the second metal layer.

Lines (the gate lines GL, for example) that are formed by the first metal layer and that are electrically connected to the gate electrodes G may be used as the lines W11, or lines formed by the second metal layer, such as the capacity wiring lines CL, may be used. Further, lines (the source lines that are not illustrated, for example) that are formed by the third metal layer and that are electrically connected to the source lines S, may be used as the lines W32.

A plurality of slits are provided as openings in the organic insulating film 19. The above-described slits include slits S1a1, S1a2, S1b, S2, S2', S3, S3', and S4. As illustrated in FIG. 1 to FIG. 3, the organic insulating film 19 is divided by the above-described slits, or, alternatively, is configured by a plurality of organic insulating film pattern portions in which the slits are provided.

The organic insulating film 19 includes: first organic insulating film pattern portions 19A and 19A' that are formed, respectively, in island shapes on either side of the folding portion 7; second organic insulating film pattern portions 19B and 19B' that are formed, respectively, in a frame shape so as to surround each of the first organic insulating film pattern portions 19A and 19A' and that are separated from each of the first organic insulating film pattern portions 19A and 19A'; a third organic insulating film pattern portion 19C including a frame portion 19C1 that surrounds, in a frame shape, the periphery of both the second organic insulating film pattern portions 19B and 19B', and a cross-piece portion 19C2 formed in a cross-piece shape between both the second organic insulating film pattern portions 19B and 19B' so as to partition both the second organic insulating film pattern portions 19B and 19B'; and a terminal portion organic insulating film pattern portion 19T that covers the edge portions of the terminals TM.

The first organic insulating film pattern portion 19A and the second organic insulating film pattern portion 19B that surrounds the first organic insulating film pattern portion 19A, and the first organic insulating film pattern portion 19A' and the second organic insulating film pattern portion 19B' that surrounds the first organic insulating film pattern portion 19A' are provided, respectively, on either side of the folding portion 7. The cross-piece portion 19C2 of the third organic insulating film pattern portion 19C is provided inside the folding portion 7, along the direction in which the folding portion 7 extends.

The first organic insulating film pattern portion 19A and the first organic insulating film pattern portion 19A' provided on either side of the folding portion 7 have the same shape, respectively. Similarly, the second organic insulating film pattern portion 19B and the second organic insulating film pattern portion 19B' provided on either side of the folding portion 7 have the same shape, respectively.

The first organic insulating film pattern portions 19A and 19A', the second organic insulating film pattern portions 19B and 19B', the third organic insulating film pattern portion 19C, and the terminal portion organic insulating film pattern portion 19T are all provided in the same plane, respectively.

As illustrated in FIG. 2, a slit S1a is provided as a slit (opening) in the first organic insulating film pattern portion 19A. In a plan view, the slit S1a has a frame shape, with parts thereof cut out, that surrounds the display unit 5 excluding formation regions in which the plurality of lines W11 and the plurality of lines W33 are formed, and is provided between the display unit 5 and the second electrode 23 of the organic EL element 24, on an edge portion of the second electrode 23 parallel to the folding portion 7 along the edge portion of the second electrode 23. More specifically, as the above-described slit S1a, excluding a formation region of the plurality of lines W11 provided between the display units 5 and 5' (in other words, a part of a region between the display units 5 and 5'), and a formation region of the plurality of lines W33 provided between the terminal portion 12T and the display unit 5 (in other words, a part of a region between the terminal portion 12T and the display unit 5), the slit S1a configured by the slits S1a1 and S1a2, which are recess-shaped and which face each other in a plan view, is provided in the first organic insulating film pattern portion 19A along the edge portion of the second electrode 23.

Further, as illustrated in FIG. 2, the slit S1b is provided, as the opening, in the first organic insulating film pattern portion 19A'. In a plan view, the slit S1b has a frame shape, that surrounds the display unit 5', excluding the formation region of the above-described plurality of lines W11 (in other words, the part of the region between the terminal portion 12T and the display unit 5), with a part (specifically, the above-described part of the region) thereof cut out, and is provided between the display unit 5' and the second electrode 23 of the organic EL element 24 along the edge portion of the second electrode 23.

Among the plurality of lines formed on the TFT layer 12, a part of some of the lines W31 is exposed in the slits S1a1, S1a2, and S1b. The second electrode 23, which is a common electrode (common negative electrode) formed on one surface of the display units 5 and 5', is electrically connected to the above-described lines W31 via the above-described slits S1a1, S1a2, and S1b.

Lines (the source lines that are not illustrated, for example) that are electrically connected to the source electrodes S, may be used as the above-described lines W31.

In FIG. 1, the example is illustrated of the case in which the lines of the same layer as the source electrodes S formed by the third metal layer are used as the lines W31, but as long as the lines W31 are some of the lines formed on the TFT layer 12, they may be formed on any one of the first metal layer to the third metal layer.

As described above, when the inorganic insulating layer is provided on the folding portion 7, by using the lines of the differing layers as the lines W31 and the lines W33, a second electrode connecting portion 8 can be formed across the whole region between the adjacent display units 5 and 5', as illustrated by an embodiment to be described later.

The lines W33 are lead-out lines of each of the lines, and the terminals TM are electrically connected to the source electrodes S or the gate electrodes G, for example, via the lines W33.

Although not illustrated, the gate lines GL and the source lines are crossed so as to be orthogonal to each other in a plan view. A region defined by the gate lines GL and the source lines SL (for example, a region surrounded by a lattice shape) is a pixel 3, and a single picture element is formed by a set of the pixels 3 of each color (red (R), blue (B), and green (G), for example). The TFTs 18 are respectively provided on each of the pixels 3.

The TFT 18 selects the pixel 3 of a signal input by the gate lines GL, determines an amount of an electric charge input to the selected pixel 3 by the source lines, and supplies the high level potential ELVDD to the organic EL element 24 from the high level power source line ELVDD, while also supplying the low level potential ELVSS to the organic EL element 24 from the low level power source line ELVSS.

Note that, in FIG. 1, an example is illustrated of a case in which the TFT 18 has a top gate configuration with the semiconductor layer 13 as a channel, but the TFT 18 may have a bottom gate configuration.

The slit S2 is provided between the first organic insulating film pattern portion 19A and the second organic insulating film pattern portion 19B, as the slit (opening). The slit S2 is provided so as to surround the first organic insulating film pattern portion 19A.

Similarly, the slit S2' is provided between the first organic insulating film pattern portion 19A' and the second organic insulating film pattern portion 19B', as the slit (opening). The slit S2' is provided so as to surround the first organic insulating film pattern portion 19A'.

It is preferable that an interior of each of the slits S2 and S2' is covered by a first inorganic layer 31 of the sealing film 30.

In this way, by using the above-described slits S2 and S2' to partition the organic insulating film 19 (the flattening film) between the slits S1a and S1b that expose the part of the lines W31 and a bank BK5 that is an organic layer stopper (to be described later), a path of moisture penetration to the slits S1a and S1b can be blocked, and the reliability of the above-described flexible display device 1 can be improved.

Further, the slit S3 is provided between the second organic insulating film pattern portion 19B and the third organic insulating film pattern portion 19C, as the slit (opening). The slit S3 is provided so as to surround the second organic insulating film pattern portion 19B.

Similarly, the slit S3' is provided between the second organic insulating film pattern portion 19B' and the third organic insulating film pattern portion 19C, as the slit (opening). The slit S3' is provided so as to surround the second organic insulating film pattern portion 19B'.

As illustrated in FIG. 2 and FIG. 3, as well as the terminal portion 12T, on which are formed the terminals TM of each of the lines, being provided in a part of the frame region 6 that faces an edge portion of the OLED panel 2 so as to be separated from the third organic insulating film pattern portion 19C, a mounting region for a flexible printed circuit (FPC) substrate (not illustrated) is also provided. The terminal portion 12T, on which the plurality of terminals TM are provided, and the FPC substrate are adhered using an Anisotropic Conductive Film (ACF) (not illustrated).

Various signals supplied from a display control circuit (not illustrated) or a reference potential are input to the terminal portion 12T via the lead-out lines, and in this way, driving of the TFT 18 is controlled. Note that the above-described display control circuit may be mounted on a control substrate connected via the FPC substrate, or may be provided on the FPC substrate.

The display control circuit is provided with an input connector, a timing controller, and a power source integrated circuit (IC). The display control circuit supplies, to the gate driver (not illustrated), a timing signal, such as a gate start pulse signal, a gate clock signal and the like, a power source, and (where necessary) an address designation signal and the like, and at the same time supplies, to the source driver (not illustrated), a timing signal, such as a source start pulse signal, a source clock signal, a polarity inversion signal and the like, gray scale data, a power source and the like.

Note that the gate driver and the source driver may be provided on the above-described FPC substrate, and may be provided in the frame region 6 of the OLED panel 2.

Further, each of the gate driver and the source driver may be formed by a single IC chip, and the gate driver or the source driver formed of the single IC chip may be provided in a plurality thereof. In addition, the configuration of the gate driver may be included in the IC chip including the source driver, or a part of the display control circuit may be included.

Each of the gate lines GL and each of the emission lines are respectively connected to the gate driver, and the source lines are connected to the source driver. The gate driver drives each of the gate lines GL and each of the emission lines on the basis of the control signal, such as the clock signal, received from the display control circuit part (not illustrated). Further, the source driver drives each of the source lines in accordance with a control signal input from the display control circuit.

As illustrated in FIG. 2, in a plan view, the terminal portion 12T is provided in the frame region 6 between the display unit 5 and the edge portion of the TFT substrate 10 (in other words, the edge portion of the above-described OLED panel 2), so as not to overlap with the folding portion 7.

Each of the lines are provided so as to be common to the adjacent display units 5 and 5' on either side of the folding portion 7. In this way, in the present embodiment, the lines are provided through the folding portion 7 so as to be common to the plurality of display units (the display units 5 and 5' in the example illustrated in FIG. 1 and FIG. 2), and the plurality of display units provided on either side of the folding portion 7 are driven by the same lines and terminal portion 12T.

Each of the lines, and the TFTs 18, are covered by a part of the organic insulating film 19 that is the flattening film.

For example, the first organic insulating film pattern portions 19A and 19A' respectively cover the organic insulating film 16 and the third metal layer formed on the organic insulating film 16. In this way, the first organic insulating film pattern portions 19A and 19A' level out steps on the TFTs 18 and the third metal layer in the display units 5 and 5'.

In the example illustrated in FIG. 1 and FIG. 3, the first organic insulating film pattern portions 19A and 19A', the second organic insulating film pattern portions 19B and 19B', the third organic insulating film pattern portion 19C, and the terminal portion organic insulating film pattern portion 19T are all provided at the same height as each other. For example, since the first organic insulating film pattern portion 19A and the second organic insulating film pattern portion 19B are formed to be the same height as each other, a material of an organic layer 32 (to be described later) flows in evenly onto the first organic insulating film pattern portion 19A and the second organic insulating film pattern portion 19B. Similarly, since the first organic insulating film pattern portion 19A' and the second organic insulating film pattern portion 19B' are formed to be the same height as each other, the material of the organic layer 32 (to be described later) flows in evenly onto the first organic insulating film pattern portion 19A' and the second organic insulating film pattern portion 19B'.

However, the present embodiment is not limited thereto. The height of each of the organic insulating film pattern portions, in particular, the height of the third organic insulating film pattern portion 19C (specifically, the height of the frame portion 19C1 and the height of the cross-piece portion 19C2 that configure the third organic insulating film pattern portion 19C), and the height of the terminal portion organic insulating film pattern portion 19T may be the same as the height of the other organic insulating film pattern portions, or may be lower than the height of the other organic insulating film pattern portions. For example, by using a half tone mask, the height of each of the organic insulating film pattern portions can be changed as appropriate.

Note that the TFTs 18 and the organic EL elements 24 are provided on the first organic insulating film pattern portions 19A and 19A', but the TFTs 18 and the organic EL elements 24 are not provided on the second organic insulating film pattern portions 19B and 19B' and on the third organic insulating film pattern portion 19C.

Further, as the slit (opening) in the terminal portion organic insulating film pattern portion 19T that covers the edge portions of the terminals TM, the slit S4 that causes the terminals TM to be exposed is provided.

Portions of the terminals TM that are not covered by the terminal portion organic insulating film pattern portion 19T are electrically connected to an external circuit, such as a flexible film cable, an FPC substrate, an IC or the like, using an ACF or the like.

OLED Layer 20

As illustrated in FIG. 1 and FIG. 3, the OLED layer 20 includes the first electrodes 21 (bottom electrodes), an organic EL layer 22 that is formed on the first electrodes 21 and that is formed from an organic layer including at least a light emitting layer, the second electrodes 23 (top electrodes) that are formed on the organic EL layer 22, and banks BK (walls, embankments, and more specifically, banks BK1 to BK6). A plurality of slits (specifically, slits S11 to S17) are provided as openings in the banks BK. In this way, the banks BK include the plurality of banks BK1 to BK6 that are separated from each other.

The first electrode 21, the organic EL layer 22, and the second electrode 23 configure the organic EL element 24 (the OLED element, the light emitting element) that configures each of the pixels 3. In the present embodiment, the layers between the first electrode 21 and the second electrode 23 are collectively referred to as the organic EL layer 22.

As described above, as illustrated in FIG. 2, for example, the flexible display device 1 according to the present embodiment has the two display units 5 and 5' configuring the two screens of the two-page spread, on either side of the folding portion 7.

Thus, in the flexible display device 1 according to the present embodiment, the organic EL element 24 and the TFT 18 that is connected to the first electrode of the organic EL element 24 and that drives the organic EL element 24 are not provided in the folding portion 7, and the pixels configuring the display units 5 and 5' are not provided in the folding portion 7.

The first electrodes 21, the organic EL layer 22, the second electrodes 23, and the banks BK1 to BK5 are provided in the same shape, respectively, on either side of the folding portion 7.

The bank BK6 is provided on the third organic insulating film pattern portion 19C. Thus, a bulging portion 25, which is formed from the third organic insulating film pattern portion 19C and the bank BK6, is formed around the second organic insulating film pattern portions 19B and 19B' so as to surround the periphery of the second organic insulating film pattern portions 19B and 19B' in a frame shape and also to partition the two second organic insulating film pattern portions 19B and 19B'.

The bulging portion 25 includes a bulging portion 25a formed by the frame portion 19C1 and the bank BK6 provided on the frame portion 19C1, and a bulging portion 25b formed by the cross-piece portion 19C2 and the bank BK6 formed on the cross-piece portion 19C2. The above-described bulging portion 25b is formed on the folding portion 7.

Note that an optical adjustment layer (not illustrated) that performs optical adjustment, and a protection layer that protects the second electrode 23 and inhibits oxygen or moisture from infiltrating the organic EL element 24 from outside may be formed on the second electrode 23. In the present embodiment, the organic EL layer 22 formed on each of the pixels 3, the pair of electrode layers (the first electrode 21 and the second electrode 23) that sandwich the organic EL layer 22, and the optical adjustment layer and the protection layer (not illustrated) that are formed as necessary, are referred to together as the organic EL element 24.

The first electrode 21 is formed on each of the first organic insulating film pattern portions 19A and 19A' on the respective display units 5 and 5'. The first electrode 21 injects (supplies) positive holes into the organic EL layer 22 and the second electrode 23 injects electrons into the organic EL layer 22. The positive holes and the electrons injected into the organic EL layer 22 are recombined in the organic EL layer 22, and thus form excitons. The formed excitons emit light as they become deactivated from an excited state to a ground state, and the emitted light is emitted to the outside from the organic EL element 24.

The first electrodes 21 are electrically connected to the TFTs 18 via a contact hole formed in the organic insulating film 19.

The first electrode 21 is a pattern electrode formed in an island shape for each of the pixels 3, and is formed in a matrix shape, for example, on each of the first organic insulating film pattern portions 19A and 19A'. Meanwhile, the second electrode 23, for example, is a solid-like common electrode provided in common to the pixels 3 (namely, the plurality of pixels 3).

In a plan view, the second electrode 23 is provided on each of the display units 5 and 5' so as to cover each of the display units 5 and 5'. Between the second electrode 23 that covers the display unit 5 in a plan view and the second electrode 23 that covers the display unit 5' in a plan view, a slit (opening) is provided. As illustrated in FIG. 1 and FIG. 2, the second electrode 23 has a slit 23a in the folding portion 7.

As described above, the second electrodes 23 are connected to the lines W31 formed on the TFT layer 12, at the second electrode connecting portion 8.

As illustrated in FIG. 1 and FIG. 3, among the banks BK, the banks BK1 are respectively disposed inside the display units 5 and 5'. Meanwhile, the banks BK2 to BK 6 are disposed in the frame region 6.

Slits (openings) are respectively provided between each of the banks BK. The slits S11 are provided between the banks BK1 and the banks BK2. The slits S12 are provided between the banks BK2 and the banks BK3. In the example illustrated in FIG. 1 and FIG. 3, the banks BK3 are formed in a double-frame shape. Thus, the slits S13 are provided between the adjacent banks BK3. The slits S14 are provided between the banks BK3 and the banks BK4. Further, in the example illustrated in FIG. 1 and FIG. 3, the banks BK4 are formed in the double-frame shape, similarly to the banks BK3. Thus, the slits S15 are provided between the adjacent banks BK4. The slits S16 are provided between the banks BK4 and the banks BK5. The slits S17 are provided between the banks BK5 and the banks BK6.

The banks BK1 are formed on the organic insulating film pattern portion 19 of the display units 5 and 5' (specifically, on the first organic insulating film pattern portions 19A and 19A' in the display units 5 and 5').

The banks BK1 provided on each of the display units 5 and 5' are respectively provided in a lattice shape in a plan view, for example, so as to cover the peripheral portions (namely, the edge portions) of the first electrodes 21 provided on each of the display units 5 and 5'. The banks BK1 function as edge covers that inhibit, at the peripheral portions of the first electrodes 21, a short circuit with the second electrode 23 due to current concentration or thinning of the organic EL layer 22, and also function as a pixel separation layer that separates the pixels 3 such that electric current does not leak to the adjacent pixel 3.

The bank BK1 has a protrusion T for each of the plurality of pixels 3. The bank BK1 includes a low bank portion BK1a having a first height h11, and a high bank portion BK1b having a second height h12 that is higher than the first height h11. The high bank portion BK1b has a configuration, for example, in which the protrusion T is provided, as an upper step bank, on the low bank portion BK1a that forms a lower step bank.

The protrusion T (in other words, the high bank portion BK1b including the protrusion T) is used as a spacer (support body) that supports a mask for vapor deposition (not illustrated) that is used for performing a selective vapor deposition to layers, such as the organic EL layer 22 and the like, formed inside an opening BK1A of the bank BK1. The mask for vapor deposition is supported in a state of being separated, for example, from a film-deposited substrate that is used in the vapor deposition, as well as from the banks BK3 and BK4, such that the above-described mask for vapor deposition does not come into contact with a surface of the film-deposited substrate.

The height of the protrusion T is not particularly limited, and is set such that the height h12 of the high bank portion BK1b is greater than h11. As an example, the height h11 of the low bank portion BK1a is formed to be from 1 μm to 2.5 μm, and the height h12 of the high bank portion Bk1b is formed to be from 1.5 μm to 3.5 μm (h11 is less than h12).

Further, as illustrated in FIG. 1, on the inside of the frame-shaped banks BK5 and BK5 that are the organic layer stoppers, on the periphery of the display units 5 and 5' (namely, in a plan view, the frame region 6 between the display unit 5 and the bank BK5 that surrounds the display unit 5, and also the frame region 6 between the display unit 5' and the bank BK5 that surrounds the display unit 5'), the frame-shaped banks BK formed on the flattening films (the first organic insulating film pattern portions 19A and 19A' and the second organic insulating film pattern portions 19B and 19B') include a first bank (hereinafter referred to as a "low bank") that has a third height, and a second bank (hereinafter referred to as a "high bank") that has a fourth height that is higher than the third height.

In the example illustrated in FIG. 1, the banks BK2 formed on each of the first organic insulating film pattern portions 19A and 19A' are the low banks, and the banks BK3 and BK4 that are formed on the outside of each of the banks BK2 so as to respectively surround the banks BK2 are the high banks. As illustrated in FIG. 1, with respect to a height h21 of the bank BK2, the banks BK3 and BK4 are formed to be higher than the height h21 of the bank BK2.

Note that the fourth height (a height h31 of the bank BK3 and a height h41 of the bank BK4) may be the same as the second height (the height h12 of the high bank portion BK1b). Further, the third height (the height h21 of the bank BK2) may be the same as the first height (the height h11 of the low bank portion BK1a).

Note that the above-described h11, h12, and h2 to h4 indicate the heights from the surface of the organic insulating film 19, which is the flattening film, to the upper face of each of the banks BK.

In the bank BK1, the opening BK1A is provided for each of the pixels 3. Exposed parts of the first electrode 21 exposed by the openings BK1A form a light emitting region of each of the pixels 3.

When, selective deposition is performed such that the organic EL layer 22 of the organic EL elements 24 emits a different color light for each of the pixels 3, as illustrated in FIG. 1 and FIG. 3, the organic EL layer 22 is formed for each of the regions (the pixels 3) surrounded by the banks BK1.

For example, the organic EL layer 22 is configured by layering a hole injecting layer, a hole transport layer, a light emitting layer, an electron transport layer, and an electron injecting layer, in the above order from the first electrode 21 side. A single one of the layers may have a plurality of functions. For example, in place of the hole injecting layer and the hole transport layer, a hole injection-cum-transport layer may be provided that has the functions of both the layers. Further, in place of the electron injecting layer and the electron transport layer, an electron injection-cum-transport layer may be provided that has the functions of both the layers. In addition, a carrier blocking layer may be provided between each of the layers as appropriate.

Note that the above-described layering order is for a case in which the first electrode 21 is the positive electrode and the second electrode 23 is the negative electrode, and when the first electrode 21 is the negative electrode and the second electrode 23 is the positive electrode, the order of each of the layers configuring the organic EL layer 22 is reversed.

When the flexible display device 1 is the bottom-emitting type that emits the light from a back surface side of the support body 11, it is preferable that the second electrode 23 be formed by a reflective electrode, and the first electrode 21 be formed by a transparent electrode, such as an indium tin oxide (ITO), or by a semi-transparent translucent electrode formed from a thin film of a metal such as gold (Au). At this time, with the object of injecting electrons into the light emitting layer, a metal with a small work function, such as lithium (Li), aluminum (Al) or the like, or an alloy containing such a metal, such as a magnesium alloy (MgAg or the like), an aluminum alloy (AlLi, AlCa, AlMg or the like) is used as the second electrode 23.

Meanwhile, when the flexible display device 1 is the top-emitting type that emits the light from the sealing film 30 side, it is preferable that the first electrode 21 be formed by a reflective electrode material, and the second electrode 23 be formed by a transparent or semi-transparent translucent electrode material.

The first electrode 21 and the second electrode 23 may each have a single layer structure or may each have a layered structure. For example, when the organic EL element 24 is the top-emitting organic EL element, the first electrode 21 may have a layered structure configured by a reflective electrode and a transparent electrode.

Meanwhile, the banks BK2 to BK4 are formed on the organic insulating film 19 in the frame region 6.

Of these banks BK2 to BK4, the banks BK2 are formed in a frame shape on the first organic insulating film pattern portions 19A and 19A' of the frame region 6, so as to respectively surround the display units 5 and 5'.

In other words, the lattice shaped banks BK1, and the banks BK2 that are formed on the outside of the lattice shaped banks BK1 in the frame shape so as to surround each of the lattice shaped banks BK1, are provided on the first organic insulating film pattern portions 19A and 19A', respectively.

The banks BK3 are each formed in a frame shape on the first organic insulating film pattern portions 19A and 19A' of the frame region 6 so as to respectively surround each of the banks BK2 provided on the first organic insulating film pattern portions 19A and 19A'.

As illustrated in FIG. 1, between the display units 5 and 5', the second electrodes 23 provided on each of the display units 5 and 5' are electrically connected to the lines W31 formed on the TFT layer 12, via the slits S12 between the banks BK2 and the banks BK3, and via the slits S1a and S1b (namely, the slits S1a1, S1a2, and S1b), which are provided in the first organic insulating film pattern portions 19A and 19A' and which are communicated with the slits S12.

The banks BK4 are each formed in a frame shape on the second organic insulating film pattern portions 19B and 19B' so as to respectively surround each of the banks BK3 provided on the first organic insulating film pattern portions 19A and 19A'.

Each of these banks BK3 and BK4 may be formed in a line shape, or may be formed in a dotted shape. For example, the banks BK3 may be formed by a plurality of dot-shaped banks that are provided so as to be separated from each other, and each of the dot-shaped banks may be arranged in a plurality of rows to form an intermittent frame shape. At the same time, the adjacent rows of dot-shaped banks may have a configuration in which they are regularly arranged, in a plan view, in a zig-zag shape with respect to each other. Similarly, the banks BK4 may be formed by a plurality of dot-shaped banks that are provided so as to be separated from each other, and each of the dot-shaped banks may be arranged in a plurality of rows to form an intermittent frame shape. At the same time, the adjacent rows of dot-shaped banks may have a configuration in which they are regularly arranged, in a plan view, in a zig-zag shape with respect to each other.

Note that, in FIG. 1 and FIG. 3, an example is given of a case in which the respective banks BK3 and BK4 have a double-frame shape, but the present embodiment is not limited to this example. When the banks BK3 and BK4 are the dot-shaped banks, the dot-shaped banks may be formed in a multi-frame shape with a greater number than the double-frame shape, respectively.

Further, when the banks BK3 and BK4 are formed in the line shape so as to be continuous to each other, each of the banks BK3 and BK4 need not necessarily be formed in the multi-frame shape.

After a liquid organic material that is used for the organic layer 32 is applied using an ink-jet method or the like, these banks BK2 to BK4 align edges of the above-described wetly spreading liquid organic material, inhibit a flow of the above-described wetly spreading liquid organic material, and align the edge portions of the above-described liquid organic material to be in a substantially straight line shape.

By the above-described liquid organic material passing the banks BK2 to BK4 and spreading wetly, the banks BK2 to BK4 function as resistance. Thus, by the above-described liquid organic material passing the banks BK2 to BK4, the speed of the wet spreading decreases. According to the present embodiment, in this way, by providing the banks BK2 to BK4 further to the inside than the frame-shaped banks BK5, the flow of the liquid organic material can be inhibited.

Further, the second organic insulating film pattern portions 19B and 19B' are separated from the first organic insulating film pattern portions 19A and 19A', and thus these second organic insulating film pattern portions 19B and 19B', on which the banks BK4 are provided, are used as dam portions to inhibit the infiltration of moisture into the TFTs 18 and the organic EL elements 24 inside the first organic insulating film pattern portions 19A and 19A'.

As described above, the interior of the slit S2 between the first organic insulating film pattern portion 19A and the second organic insulating film pattern portion 19B, and the interior of the slit S2' between the first organic insulating film pattern portion 19A' and the second organic insulating film pattern portion 19B' are preferably both covered by the first inorganic layer 31 of the sealing film 30.

The slits S2 and S2' are formed in a frame shape on the outside of the slits S1a and S1b used to connect the second electrodes 23 to the lines W31, so as to surround the slits S1a and S1b. Thus, the organic insulating film 19 that is the flattening film has the slits S2 and S2' provided so as to surround the second electrodes 23, in a plan view, between the second electrodes 23 (in other words, the slits S1a and S1b that define the edges of the second electrodes 23) and the edges of the second organic insulating film pattern portions 19B and 19B' (in other words, the slits S3 and S3' that divide the bulging portion 25).

Since the bank BK5 holds back the liquid organic material used in the organic layer 32 (in other words, holds back the organic layer 32), it functions as an organic layer stopper that defines the edges of the organic layer 32, and the edges of the organic layer 32 are overlapped with the bank BK5. The liquid organic material used in the organic layer 32 easily accumulates on a flat portion on the upper face of the bank BK5 and is held back by the above-described flat portion. Thus, as illustrated in FIG. 1, the edges of the organic layer 32 are overlapped with the upper face (top face) of the bank BK5 and the organic layer 32 is not present on the outside of the frame-shaped bank BK5.

In a plan view, on the outside of the second organic insulating film pattern portions 19B and 19B', the banks BK5 are formed, not in a dot shape, but in the frame shape that is formed by a continuous line of a constant width, so as to surround each of the second electrodes 23. In other words, the banks BK5 are provided between the second electrodes 23 and the bulging portion 25. As a result, in a plan view (namely, when seen from the upper face of the flexible display device 1), the edges of the organic layer 32 are positioned between the second electrodes 23 and the bulging portion 25.

Further, a slit (opening) is provided between the organic layer 32 that covers the display unit 5 in a plan view and the organic layer 32 that covers the display unit 5' in a plan view. As illustrated in FIG. 1 and FIG. 2, the organic layer 32 has a slit 32a, in the folding portion 7, that partitions the organic layer 32.

In the example illustrated in FIG. 1 and FIG. 3, the banks BK5 are provided in the slit S3 between the second organic insulating film pattern portion 19B and the third organic insulating film pattern portion 19C, and the slit S3' between the second organic insulating film pattern portion 19B' and the third organic insulating film pattern portion 19C. Thus, the banks BK5 are provided on the inorganic insulating film (the inorganic insulating film 16 in the example illustrated in FIG. 1) that is the underlayer on which the organic insulating film 19 is provided, without the organic insulating film 19 being interposed therebetween.

Here, when a height of the banks BK5 (namely, the height from the surface of the underlayer (the inorganic insulating film 16 in the example illustrated in FIG. 1), on which the organic insulating film 19 and the banks BK5 are provided, to the upper faces of the banks BK5) is a height H2, H2 is preferably 3 μm or greater, and even more preferably 3.5 μm or greater, in order to minimize a distance from the banks BK5 to where a film thickness of the organic insulating film 32 becomes level.

Further, when a height from the surface of the underlayer (the inorganic insulating film 16 in the example illustrated in FIG. 1), on which the organic insulating film 19 and the banks BK5 are provided, to upper faces of each of the high bank portion BK1b and the banks BK3 and BK4, which are contact faces with the mask for vapor deposition, is a height H1, H2 may be lower than H1, as illustrated in FIG. 1, for example.

As described above, the bulging portion 25 includes the bulging portion 25a formed by the frame portion 19C1 and the bank BK6 provided on the frame portion 19C1, and the bulging portion 25b formed by the cross-piece portion 19C2 and the bank BK6 formed on the cross-piece portion 19C2.

Along with each of the banks BK3 and BK4 provided on either side of the folding portion 7, the bulging portion 25 is used, for example, as a spacer (support body) to support a mask M1 for vapor deposition (see FIG. 4A) used in the vapor deposition of the second electrodes 23, in a state of being separated from the film-deposited substrate. The upper face of the bulging portion 25 (namely, the upper face of the bank BK6) is level and is used as a contact face (abutting face) for the above-described mask M1. Thus, the bulging portion 25 is formed so as to surround the second electrode 23.

When a height of the bulging portion 25, namely, the height from the surface of the organic insulating film 19 and the underlayer (the inorganic insulating film 16 in the example illustrated in FIG. 1), on which the banks BK5 are provided, to the upper face of the bulging portion 25 is a height H3, within the display units 5 and 5′, H3 is a height that is the same as or less than the height of a portion at which a total of the height (thickness) of the first organic insulating film pattern portion 19A that is the flattening film and the height of the banks BK1 that are the edge covers is at its highest.

In other words, H3 is not higher than the above-described height H1 from the surface of the underlayer to the upper faces of the high bank portions BK1b in the display units 5 and 5′, and may be the same as H1 or lower than H1. In the display units 5 and 5′, H1 is a total height of the height (thickness) of the first organic insulating film pattern portion 19A that is the flattening film and the height h12 of the high bank portions BK1b, and, as described above, h12 is from 1.5 μm to 3.5 μm, for example. Further, the thickness of the organic insulating film 19 is not particularly limited, and is from 1 to 3 μm, for example. In addition, H2 is lower than H3, and the bulging portion 25 is formed, for example, such that H1>H3>H2. As described above, H2 is preferably 3 μm or greater, and is even more preferably 3.5 μm or greater. Thus, H1 and H3 are each formed, for example, to be 3.5 μm or greater. The bulging portion 25a and the bulging portion 25b of the bulging portion 25 have the same height.

As described above and as illustrated in FIG. 1 and FIG. 2, the second electrode 23 has the slit 23a in the folding portion 7. Of the bulging portion 25, the bulging portion 25b is arranged in the folding portion 7, along the direction in which the folding portion 7 extends. Specifically, when the above-described flexible display device 1 is seen from above (in a plan view in other words), the bulging portion 25b is arranged in the above-described slit 23a, along the direction in which the slit 23a extends. The plurality of lines W11 that are electrically connected to the display units 5 and 5′ are formed in the above-described slit 23a. Thus, as illustrated in FIG. 2, the lines W11 intersect the bulging portion 25b at the above-described slit 23a.

The banks BK1 to BK5 are formed from an organic insulating material. The banks BK1 to BK5 are formed, for example, from a photosensitive resin, such as an acrylic resin and a polyimide resin. The banks BK1 to BK5 can be formed in the same production process, for example.

Note that, in order to improve coverage of a formation surface on which each of the banks BK are formed, a cross-section thereof is preferably a forwardly tapered shape.

Further, although not illustrated, a protrusion having a flat upper face may be provided on the upper face of each of the banks BK, and the banks BK1 to BK6 may have a double layer configuration or a triple layer configuration.

Sealing Film 30

The sealing film 30 includes the first organic layer 31 (a lower layer inorganic sealing layer, a first inorganic sealing layer), the organic layer 32 (an organic sealing layer), and a second inorganic layer 33 (an upper layer inorganic sealing layer, a second inorganic sealing layer), layered in the above order from the TFT substrate 10 side.

The first inorganic layer 31 and the second inorganic layer 33 have a moisture-proof function to inhibit the infiltration of moisture, and function as barrier layers to inhibit deterioration of the organic EL element 24 caused by moisture or oxygen.

The organic layer 32 is used as a buffer layer (a stress relief layer), which relieves stress in the first inorganic layer 31 and the second inorganic layer 33 in which film stress is large, performs leveling and filling of pinholes by burying step portions and foreign material on the surface of the OLED layer 20 in the display units 5 and 5′, and further, suppresses the generation of cracks in the second inorganic layer 33 when the second inorganic layer 33 is layered, by leveling a foundation of the second inorganic layer 33.

The first inorganic layer 31 and the second inorganic layer 33 are each formed by CVD, for example, and each can be configured by a silicon oxide film, a silicon nitride film, or a silicon oxinitride film, or by a layered film of these films.

The organic layer 32 is thicker than the first inorganic layer 31 and the second inorganic layer 33, and is a translucent organic insulating film. The organic layer 32 is formed, for example, by applying a liquid organic material on the first inorganic layer 31 on the display units 5 and 5′ using an ink-jet method, and hardening the liquid organic material. A photosensitive resin, such as an acrylic resin film, an epoxy resin film, a silicon resin film or the like can be used as the above-described organic material. As the liquid organic material, the organic layer 32 can be formed, for example, by performing ink-jet application of an ink including this type of photosensitive resin onto the above-described first organic layer 31, and then performing ultraviolet (UV) hardening.

The sealing film 30 is larger than the second electrode 23, in a plan view. The first inorganic layer 31, the organic layer 32, and the second inorganic layer 33 respectively cover the second electrode 23, in a plan view.

In a plan view, the first inorganic layer 31 is formed on the support body 11 over substantially an entire surface of a region surrounded by the bulging portion 25a, such that the edges of the first inorganic layer 31 abut against the bulging portion 25a. In the region surrounded by the bulging portion 25a, the first inorganic layer 31 covers the organic insulating film 19 (specifically, all of the organic insulating film 19 excluding the frame portion 19C1 and the terminal portion organic insulating film pattern portion 19T) and the underlayer of the organic insulating film 19, the second electrode 23 (including the second electrode 23 on the banks BK1 and BK2), and the banks BK not covered by the second electrode 23 (namely, the banks BK3 to BK5, and the bank BK6 provided on the cross-piece portion 19C2).

In a region surrounded by the banks BK5, the organic layer 32 covers the organic insulating film 19 (specifically, the first organic insulating film pattern portions 19A and 19A' and the second organic insulating film pattern portions 19B and 19B'), the second electrode 23 (including the second electrode 23 on the banks BK1 and BK2) and the banks BK3 and BK4, with the first inorganic layer 31 interposed therebetween. The organic layer 32 also covers an end face of the bank BK5 on the bank BK4 side, and a part of the upper face of the bank BK5.

The organic layer 32 is provided in the region surrounded by the banks BK5. As described above, the edges of the organic layer 32 are overlapped with the banks BK5.

The second inorganic layer 33 is formed so as to be superimposed on the first inorganic layer 31. Similar to the first inorganic layer 31, in a plan view, the second inorganic layer 33 is formed on the support body 11 over substantially the entire surface of the region surrounded by the bulging portion 25a, such that the edges of the second inorganic layer 33 abut against the bulging portion 25a. When the organic layer 32 is exposed, moisture and the like infiltrate from the exposed surface of the organic layer 32. Thus, the first inorganic layer 31 and the second inorganic layer 33 that are the inorganic sealing films are formed to sandwich the organic layer 32 that is the organic sealing film, such that the organic layer 32 is not exposed to the outside.

In the region surrounded by the bulging portion 25a, the second organic layer 33 covers, of the first inorganic layer 31 and the organic layer 33, the first organic insulating film 19 (specifically, all of the organic insulating film 19 excluding the frame portion 19C1 and the terminal portion organic insulating film pattern portion 19T) and the underlayer of the organic insulating film 19, the second electrode 23 (including the second electrode 23 on the banks BK1 and BK2), and the banks BK not covered by the second electrode 23 (namely, the banks BK3 to BK5, and the bank BK6 provided on the cross-piece portion 19C2).

Thus, the edges of the above-described organic layer 32 are covered by the above-described second inorganic layer 33. Further, as described above, the second electrode is covered by the first inorganic layer 31, the organic layer 32, and the second inorganic layer 33, and the first inorganic layer 31, the organic layer 32, and the second inorganic layer 33 (namely, the sealing film 30) are each formed to be larger than the second electrode 23 in a plan view.

Note that a cover body (not illustrated) may be provided on the sealing film 30 with an adhesive layer (not illustrated) interposed therebetween.

The cover body is a functional layer having at least one of a protective function, an optical compensation function, or a touch sensor function. The cover body may be a protective film that functions as a support body at a time of the carrier substrate, such as the glass substrate or the like, being peeled off, and may be a hard coat layer such as a hard coat film, or may be a functional film such as polarizing film, a touch sensor film or the like.

Production Method of Flexible Display Device 1

Next, a production method of the above-described flexible display device 1 will be described below with reference to FIG. 1 to FIGS. 4A to 4C.

FIGS. 4A to 4C are cross-sectional views illustrating a sequence of processes in a production process of main parts of the flexible display device 1 according to the present embodiment. Note that, in the production process of the flexible display device 1 illustrated in FIG. 2, FIGS. 4A to 4C illustrate, respectively, a part of a cross section along a line B-B, a part of a cross section along a line A-A, and a cross section along a line C-C, aligned in this order from the left in FIGS. 4A to 4C.

First, as illustrated in FIG. 4A, the resin layer 11b is formed on a carrier substrate 100, such as a glass substrate, and the barrier layer 11c is formed as a film on the resin layer 11b.

The resin layer 11b is formed, for example, by dissolving and thus liquefying the above-described resin or a precursor of the resin in a solvent, applying the liquefied resin or precursor onto the carrier substrate 100 using a slit coating or spin coating method and hardening the resin or precursor. The thickness of the resin layer 11b is from 2 to 20 μm, for example.

The barrier layer 11c is formed by the above-described inorganic insulating film, for example, and can be formed by CVD. The thickness of the barrier layer 11c is from 50 to 1500 nm, for example.

Next, as illustrated in FIG. 1 to FIG. 4A, using a known method (a known TFT process), the semiconductor layer 13, the gate insulating film 14 formed on the above-described barrier layer 11c so as to cover the semiconductor layer 13, the first metal layer formed on the gate insulating film 14, the inorganic insulating film 15 covering the first metal layer, the second metal layer formed on the inorganic insulating film 15, the inorganic insulating film 16 formed on the inorganic insulating film 15 so as to cover the second metal layer, the third metal layer formed on the inorganic insulating film 16, and the terminals TM are formed on the above-described barrier layer 11c.

Amorphous silicon, low-temperature polysilicon (LPTS), or an oxide semiconductor is used as the semiconductor layer 13, for example. Silicon oxide (SiOx) or silicon nitride (SiNx), or a layered film of silicon oxide and silicon nitride, is used as the gate insulating film 14, for example. The gate insulating film 14 is formed to have a thickness of 400 nm, for example.

For the above-described first metal layer to third metal layer and the terminals TM, for example, a single layer of a metal such as aluminum (Al), tungsten (W), molydenum (Mo), tantalum (Ta), chromium (Cr), titanium (Ti), or copper (Cu), or a layered film of these, is used. These metal layers are formed to have a thickness of from 1 μm to 30 μm, for example.

Silicon oxide (SiOx) or silicon nitride (SiNx) is used as the inorganic insulating films 15 and 16, for example. The inorganic insulating films 15 and 16 are formed to have a thickness of 300 nm, for example.

Next, a photosensitive resin, such as an acrylic resin or a polyimide resin, is applied in order to cover the above-described third metal layer, and patterning is performed by photolithography or the like, thus forming the organic insulating film 19 by the known method (a known TFT process). At this time, in the present embodiment, by forming, in the organic insulating film 19, the slit S1a configured by the slits S1a1 and S1a2, and the slit S1b that expose the lines W31, and also forming the slits S2 and S2', and the slits S3 and S3', the first organic insulating film pattern portions 19A and 19A', the second organic insulating film pattern portions 19B and 19B', and the third organic insulating film pattern portion 19C are formed. Further, as well as forming the terminal portion organic insulating film pattern portion 19T by patterning the organic insulating film 19, the terminal portions TM are exposed by forming the slits S4 in the terminal portion organic insulating film pattern portion 19T.

Note that, as long as it is possible to compensate for steps caused by the TFTs 18, the thickness of the organic insulating film 19 is not particularly limited, and is from 1 to 3 μm, for example. The first organic insulating film pattern portions 19A and 19A', and the second organic insulating film pattern portions 19B and 19B' are provided on either side of the folding portion 7 so as to be separated from the folding portion 7. Of the third organic insulating film pattern portion 19C, the frame portion 19C1 surrounds the periphery of both the second organic insulating film pattern portions 19B and 19B' in the frame shape, and the cross-piece portion 19C2 is positioned on the folding portion 7 so as to partition the two second organic insulating film pattern portions 19B and 19B'. In this way, the TFT substrate 10 is formed.

Next, a known method (a known TFT process), such as a sputtering method, is used to form a pattern of the first electrode 21 in the matrix shape. At this time, the first electrode 21 is connected to the drain electrodes D via a contact hole formed in the organic insulating film 19. The first electrode 21 is formed as a film of a thickness of 100 nm, for example.

Next, an organic film (not illustrated) that is formed, for example, by a positive-working photosensitive resin such as an acrylic resin or a polyimide resin, is formed in order to cover the above-described first electrode 21, the organic insulating film 19, and the inorganic insulating films 15 and 16.

Next, the banks BK1 to BK6 formed by above-described organic film are patterned by photolithography or the like. The banks BK1 to BK6 can be patterned using the same material in the same process, using a mask. However, the banks BK1 to BK6 may be formed in separate processes using mutually different masks and materials.

After that, the organic EL layer 22 is formed by the selective vapor deposition, corresponding to the pixels 3, for example, such that light emitting layers of each color cover the region surrounded by the bank BK1 (namely, the opening BK1A). Note that in the film formation of the organic EL layer 22, a method other than the vapor deposition method may be used, such as the ink-jet method, a printing method, or the like. The organic EL layer 22 is formed to be a film having a thickness of 250 nm or less, for example.

Next, the second electrode 23 is pattern formed by the vapor deposition method using the mask M1 for vapor deposition illustrated in FIG. 4A, for example, over the whole surface of the display units 5 and 5' of the above-described TFT substrate 10 so as to cover the organic EL layer 22 and the banks BK1 and BK2, and also so as to be electrically connected to the lines W31 of the second electrode connecting portion 8. The second electrode 23 is formed to have a thickness of 25 nm, for example.

As illustrated in FIG. 4A, in the vapor deposition of the second electrode 23, the vapor deposition is performed using, as the mask M1 for vapor deposition, an open mask having an opening M1A on a formation region of the second electrode 23 (in other words, the whole of the display units 5 and 5'), and the upper faces of the bulging portion 25 (in the present embodiment, for example, the upper face of the bulging portion 25 and the upper faces of the banks BK3 and BK4) are used as contact faces with the mask M1 (a placement surface for the mask M1).

Note that, in FIG. 4A, as an example of a vapor deposition process using the mask for vapor deposition, the example is illustrated of the vapor deposition process of the second electrode 23, but the present embodiment is not limited to this example. The upper face of the bulging portion 25 and the upper faces of the bank portions BK1b, BK3 and BK4 may be used as the contact faces for the above-described mask when performing the selective vapor deposition to the light emitting layer, using the mask for vapor deposition with an opening corresponding to the pixels 3.

In this way, the organic EL element 24 formed by the first electrode 21, the organic EL layer 22, and the second electrode 23 can be formed on the TFT substrate 10.

Next, as illustrated in FIG. 1, FIG. 3, and FIG. 4B, the sealing film 30 is formed on the TFT substrate 10 on which the organic EL elements 24 have been formed. Specifically, first, on the TFT substrate 10 on which the organic EL elements 24 have been formed, the first inorganic layer 31 that is formed from the silicon nitride or the silicon oxide is formed by CVD or the like over the whole region surrounded by the bulging portion 25a, such that the edges of the first inorganic layer 31 abut against the bulging portion 25a in a plan view. The thickness of the first inorganic layer 31 is from 500 to 1500 nm, for example.

Next, on the whole surface of the display units 5 and 5', the liquid organic material (ink, for example) that includes the photosensitive resin is applied using the ink-jet method and the like, for example. The above-described liquid organic material is held back by the bank BK5 that is the organic layer stopper, for example.

Next, the above-described liquid organic insulating material that wetly spreads inside the region surrounded by the bank BK5 is hardened. In this way, the organic layer 32 is formed that has a uniform film thickness of the edge portion along the bank BK5. The thickness of the organic layer 32 is from 4 to 12 μm, for example.

After that, the inorganic insulating film that is formed from the silicon nitride or the silicon oxide is formed by CVD or the like on the organic layer 32 and the first inorganic layer 31, thus forming the second inorganic layer 33 over substantially the whole surface of the region surrounded by the bulging portion 25a. The thickness of the second first inorganic layer 33 is from 500 to 1500 nm, for example. In this way, the sealing film 30 configured by the first inorganic layer 31, the organic layer 32, and the second inorganic layer 33 is formed.

After that, a temporarily attached film (not illustrated), which has a weak adhesive force and on which an adhesive (not illustrated) is provided, is adhered to the above-described sealing film 30. The above-described temporarily attached film functions as a support body when the resin layer 11b, on which are layered the barrier layer 11c, the TFT layer 12, the OLED layer 12, and the sealing film 30, is peeled from the carrier substrate 100.

Next, as a result of causing ablation (laser ablation) by irradiating laser beam on an interface between the carrier substrate 100 and the resin layer 11b on the reverse face side of the carrier substrate 100 (namely, the side of the opposite face to the face on which the TFT layer 12 is formed), the carrier substrate 100 is peeled off at the above-described interface, as illustrated in FIG. 4B. After that, as illustrated in FIG. 1, FIG. 3, and FIG. 4C, as the lower face film 11a, a transparent plastic film, for example, is adhered to a peeling face of the above-described resin layer 11b from which the carrier substrate 100 has been peeled.

Note that, in the above-described TFT processes, when a mother substrate formed from a large glass substrate or the like is used as the carrier substrate 100, after the above-described production processes, the OLED panel 2 is diced into individual pieces by cutting the obtained layered body. Note that, for the above-described cutting, a laser, a metal blade or the like can be used.

After that, the temporarily attached film is peeled off, and a functional film, such as a polarizing film, a touch sensor film or the like is adhered onto the above-described sealing film 30 as necessary. In this way, the flexible display device 1 according to the present embodiment is produced.

Advantageous Effects

As described above, in the flexible display device 1 according to the present embodiment, at the slit 23a of the second electrode 23, the organic insulating film 19 has the slits S2 and S2' and the slits S3 and S3', and at the same time, the banks BK have the slits S11 to S17, and the organic layer 32 has the slit 32a.

In particular, in the flexible display device 1 according to the present embodiment, in the folding portion 7, the organic insulating film 19 has the slits S3 and S3', and at the same time, the banks BK have the slit S17, and the organic layer 32 has the slit 32a.

Thus, for example, only the bulging portion 25b, which is formed by the cross-piece portion 19C2 of the third organic insulating film pattern portion 19C and the bank BK6, is provided as the organic layer on the support body 11 in the folding portion 7 of the above-described flexible display device 1. As described above, the above-described bulging portion 25b can be used as the support body (contact face) for the mask for vapor deposition, for example.

In the present embodiment, the organic layer 32 is held back by the frame-shaped banks BK5 that are the organic layer stoppers, and the organic layer 32 is not provided on the outside of the above-described frame-shaped banks BK5. Thus, in the above-described flexible display device 1, the organic layer 32 is not provided in the folding portion 7, and the second inorganic layer 33 is directly layered onto the first inorganic layer 31 of the folding portion 7.

In the present embodiment, in this way, as the folding portion 7 between the adjacent display units 5 and 5', the organic EL elements 24 and the TFTs 18 are not provided, while only the first inorganic layer 31 and the second inorganic layer 33 are provided as the sealing film 30, and the organic layer 32 is not provided. As a result, a groove portion that is thinner than the display units 5 and 5' is formed.

In particular, in the present embodiment, in the folding portion 7, regions are provided, on both sides of the bulging portion 25b (specifically, between the bulging portion 25b and the banks BK5), in which the organic insulating film 19, the organic layer 32, and the banks BK, which are thick, are not formed on the support body 11, and in which the organic EL elements 24 and the TFTs 18 are also not provided. The above-described regions are, for example, configured by the lower face film 11a, the resin layer 11b, the barrier layer 11c, the gate insulating film 14, the inorganic insulating film 15, the first inorganic layer 31, and the second inorganic layer 33, along with various lines (not illustrated) formed by the first metal layer, the second metal layer, and the third metal layer, and the inorganic insulating film 16, and the thickness thereof is extremely thin.

As a result, the flexible display device 1 can be easily folded at the above-described folding portion 7.

Further, as described above, the organic insulating film 19, the organic layer 32, and at least one layer of the banks BK (the organic insulating film 32 in the example illustrated in FIG. 1) are not provided in the above-described folding portion 7. In particular, in the present embodiment, the regions are present, in the above-described folding portion 7, in which the organic insulating film 19, the organic layer 32, and the banks BK are not provided. Thus, according to the present embodiment, stress acting on the folding portion 7 can be reduced. As a result, according to the above-described flexible display device 1, in the above-described folding portion 7, the stress acting on the inorganic layer (the first inorganic layer 31 and the second inorganic layer 33, for example) can be alleviated, and the generation of cracks in the inorganic layer can be inhibited.

Further, as described above, in the above-described flexible display device 1, the organic EL elements 24 (namely, the display units 5 and 5') are not provided in the folding portion 7, and the organic EL elements 24 are provided so as to be separated from the folding portion 7. Thus, according to the above-described flexible display device 1, damage to the organic EL elements 24 in the folding portion 7 can be inhibited.

As a result, according to the present embodiment, the flexible display device 1 can be provided in which the folding of the folding portion 7 is easy, the stress acting on the folding portion 7 can be reduced, and the damage to the inorganic layer and to the organic EL elements 24 in the folding portion 7 can be inhibited.

First Modified Example

Figure 5:
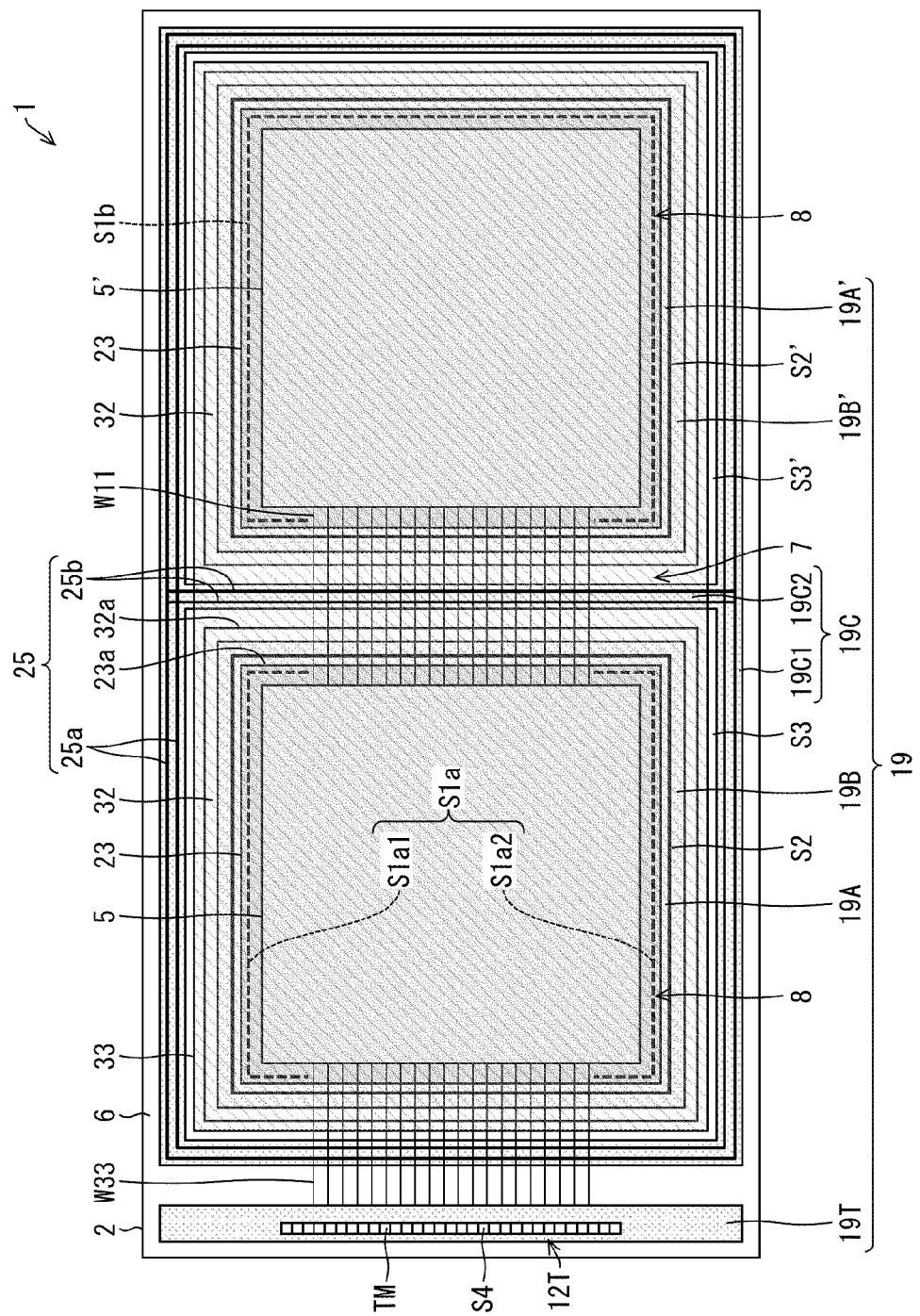
FIG. 5 is a plan view illustrating a schematic configuration of the main portions of the flexible display device according to a first modified example of the first embodiment of the disclosure.

FIG. 5 is a cross-sectional view illustrating a schematic configuration of main portions of the flexible display device 1 according to the present modified example.

As illustrated in FIG. 5, the bulging portion 25 may be formed in a plurality of line shapes. In other words, the bulging portions 25a and 25b may each be formed in a plurality of line shapes.

Second Modified Example

In the present embodiment, as illustrated in FIG. 2, the above-described flexible display device 1 is the bi-fold rectangular shaped display device, and the example is given of the case in which the display units 5 are divided into two by the folding portion 7. However, the present embodiment is not limited thereto.

With respect to the above-described flexible display device 1, two of the folding portions 7 may be provided along the lateral direction of the flexible display device 1 so as to divide each side in the longitudinal direction into three equal parts, and the flexible display device 1 may be a tri-fold display device whose display units 5 are divided into three by the above-described folding portions 7. Further, the above-described flexible display device 1 may be a multi-fold display device that has four or more folds.

Third Modified Example

Further, as described above, in the present embodiment, as the example of the display device according to the present embodiment, the flexible display device 1 that includes the organic EL elements 24 (the OLED elements) as the light emitting elements is described as the example. However, the flexible display device 1 according to the present embodiment is not particularly limited, as long as it is the flexible display device provided with bendable optical elements. The above-described optical element can include, for example, an electro-optical element in which luminance and transmittance are controlled by an electric current, or an electro-optical element in which luminance and transmittance are controlled by voltage can be used.

The above-described display panel (display device) can include, for example, an electroluminescence (EL) display provided with organic light emitting diode (OLED) elements, an EL display such as an inorganic display provided with inorganic light emitting diode elements (inorganic EL elements), or a QLED display provided with quantum dot light emitting diode (QLED) elements. The above-described OLED elements, inorganic light emitting diode elements, and QLED elements are light emitting elements, and the luminance and transmittance thereof are controlled by an electric current, for example.

Fourth Modified Example

Further, in the present embodiment, the example is given of the case in which the sealing film 30 is configured by the first inorganic layer 31 (the inorganic sealing layer), the second inorganic layer 33 (the inorganic sealing layer), and the organic layer 32 (the organic sealing layer) sandwiched between the above-described first inorganic layer 31 and second inorganic layer 33.

However, the present embodiment is not limited thereto. As long as the sealing film 30 includes an inorganic layer (inorganic sealing layer) and an organic layer (organic sealing layer), the sealing film 30 may include a plurality of three or more inorganic layers and a plurality of organic layers sandwiched between each of the inorganic layers, which are superimposed on each other.

Therefore, in the present embodiment and in each of embodiments described below, the first inorganic layer 31 and the second inorganic layer 33 can be interpreted to mean the inorganic layer (the inorganic sealing layer), or to mean the plurality of inorganic layers (inorganic sealing layers) superimposed on each other. Further, the organic layer 32 can be interpreted to mean the organic layer (the organic sealing layer), or to mean the at least one layer of the organic layer (organic sealing layer) sandwiched between the plurality of inorganic sealing layers.

Fifth Modified Example

Further, in the present embodiment, the example is described of the case in which the organic insulating film 19, the banks BK, and the organic insulating film 32 are respectively provided with the slits (openings) between the slits (in particular, in the folding portion 7). However, the present embodiment is not limited thereto, and it is sufficient that the above-described slits be provided in at least one layer of the organic insulating film 19, the banks BK, and the organic layer 32. In this way, by the slits being provided in at least one of the organic insulating film 19, the organic layer 32, or the banks BK, the stress acting on the folding portion 7 can be decreased.

Second Embodiment

A description follows regarding another embodiment of the disclosure, mainly with reference to FIG. 6 to FIGS. 8A to 8C. Note that, in the present embodiment, the differences with the first embodiment will be described, members having the same function as the members described in the first embodiment will be assigned the same reference signs, and a description thereof will be omitted. Further, the same modifications as those of the first embodiment can also be applied to the present embodiment.

Schematic Configuration of Flexible Display Device 1

Figure 6:
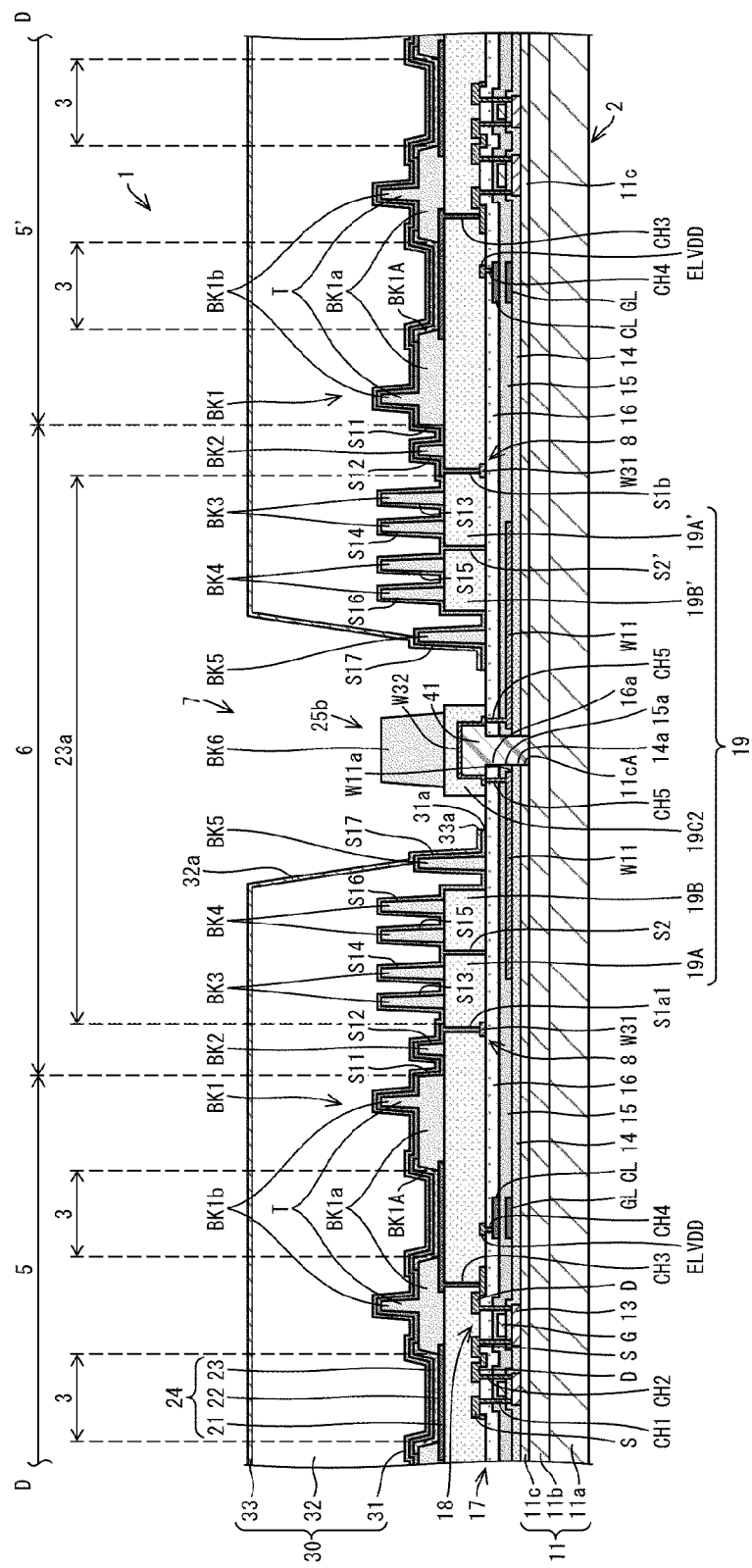
FIG. 6 is a cross-sectional view illustrating a schematic configuration around the folding portion of the flexible display device according to a second embodiment of the disclosure.
Figure 7:
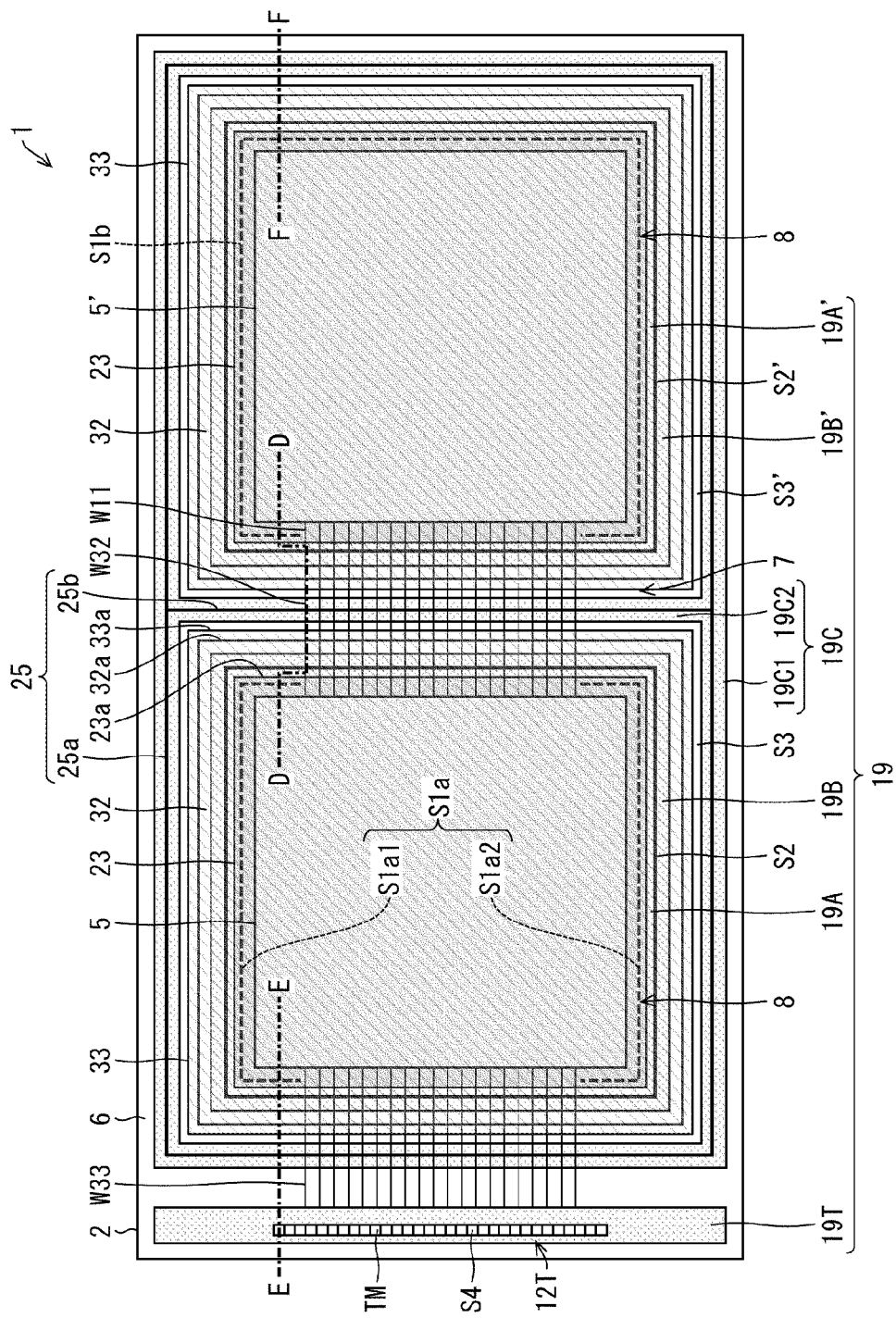
FIG. 7 is a plan view illustrating a schematic configuration of the main portions of the flexible display device according to the second embodiment of the disclosure.

FIG. 6 is a cross-sectional view illustrating a schematic configuration around the folding portion 7 of the flexible display device 1 according to the present embodiment. FIG. 7 is a plan view illustrating a schematic configuration of the main parts of the flexible display device 1 according to the present embodiment. FIG. 6 corresponds to a cross-sectional view along a line D-D of the flexible display device 1 illustrated in FIG. 7. Note that, as illustrated in FIG. 8C that will be described below, a part of a cross-sectional view along a line E-E of the flexible display device 1 illustrated in FIG. 7 is the same as the cross-sectional view illustrated in FIG. 3, namely is the same as the cross-sectional view along the line B-B of the flexible display device 1 illustrated in FIG. 1. Thus, in the present embodiment, the cross-sectional view along the line E-E of the flexible display device 1 illustrated in FIG. 7 is omitted.

The flexible display device 1 according to the present embodiment is the same as the flexible display device 1 according to the first embodiment except for the points described below.

As illustrated in FIG. 6 and FIG. 7, in a plan view, in the flexible display device 1 according to the present embodiment, in addition to the organic layer 32 and the second electrode 23, each of the inorganic layers of the flexible display device 1 (specifically, the barrier layer 11c, the gate insulating film 14, the inorganic insulating films 15 and 16, the first inorganic layer 31, the second inorganic layer 33, and the lines W11) are respectively partitioned by the slit 23a provided in the second electrode 23 (more specifically, by the folding portion 7). Further, in the present embodiment, the plurality of lines W32 connected to each of the lines W11 in the slit 23a (more specifically, the folding portion 7) are each formed in island shapes.

Thus, in the present embodiment, the inorganic layer (in other words, the inorganic layer formed across the plurality of display units 5 and 5' and covering the region between the display units 5 and 5' (in particular, the whole of the folding portion 7)) is not present on the slit 23a (more specifically, the folding portion 7).

Thus, according to the present embodiment, even when the flexible display device 1 is folded at the folding portion 7, cracks (fractures) are not generated in the inorganic layer, since the inorganic layer is partitioned at the folding portion 7. Note that, even in a case where cracks (fractures) are generated in the island-shaped inorganic layer, the cracks do not reach the display units 5 and 5'.

In the folding portion 7, the barrier layer 11c has a slit 11cA, under the bulging portion 25a and along the direction in which the folding portion 7 extends (in other words, along the direction in which the bulging portion 25b extends). Similarly, in the folding portion 7, the gate insulating film 14 has a slit 14a, under the bulging portion 25b and along the direction in which the folding portion 7 extends. In the folding portion 7, the inorganic insulating film 15 has a slit 15a, under the bulging portion 25b and along the direction in which the folding portion 7 extends. In the folding portion 7, the inorganic insulating film 16 has a slit 16a, under the bulging portion 25b and along the direction in which the folding portion 7 extends.

Further, in the present embodiment, as described above, each of the inorganic insulating layers (the barrier layer 11c, the gate insulating film 14, and the inorganic insulating layers 15 and 16) on the OLED panel 2 are partitioned, in the folding portion 7, under the bulging portion 25b, and thus, in the folding portion 7, the lines W11 also have a slit W11a, under the bulging portion 25b and along the direction in which the folding portion 7 extends (namely, the direction in which the bulging portion 25b extends).

As illustrated in FIG. 6, these slits 11cA, 14a, W11a, 15a, and 16a are provided so as to be mutually communicated with each other, and inner wall faces of the slits 11cA, 14a, W11a, 15a, and 16a are formed to be flush with each other. Thus, in the barrier layer 11c, the gate insulating film 14, the lines W11, and the inorganic insulating films 15 and 16, recessed portions are provided whose bottom face is the resin layer 11b, under the bulging portion 25b. The recessed portions penetrate the barrier layer 11c, the gate insulating film 14, the lines W11, and the inorganic insulating films 15 and 16, and have the respective slits 11cA, 14a, W11a, 15a, and 16a as the inner wall faces thereof.

The lines W11 are connected to the lines W32 via the contact hole CH5 provided in the inorganic insulating films 15 and 16. As well as the lines W11, the lines W32 are used as the lines that electrically connect the plurality of display units (the display units 5 and 5' in the present embodiment).

Underneath the lines W32, a resin layer 41 (an organic layer) is provided, as a support body (reinforcing film) that fills the interior of the above-described recessed portions (namely, the slits 11cA, 14a, W11a, 15a, and 16a), and that supports the lines W32.

The resin layer 41 is provided so as to cover the edge portions of the inorganic insulating film 16 partitioned by the slit 16a, and also to protrude from the above-described recessed portions higher than the surface of the inorganic insulating film 16. The lines W32 are provided on the resin layer 41 so as to cover the surface of the resin layer 41.

The cross-piece portion 19C2 of the third organic insulating film pattern portion 19C is formed so as to cover the lines W32. The cross-piece portion 19C2 levels out steps on the resin layer 41 and the lines W32.

In this way, in the bulging portion 25b, the lines W32 are electrically connected, by the contact hole CH5, to the lines W11 that are a part of the wiring layer that is a lower layer than the lines W32.

Note that, in the present embodiment also, similar to the first embodiment, the lines (the gate lines GL, for example) that are formed by the first metal layer and that are electrically connected to the gate electrodes G may be used as the lines W11, or the lines formed by the second metal layer, such as the capacity wiring lines CL, may be used. Thus, in the present embodiment, inside the slit 23a of the second electrode 23 (more specifically, the folding portion 7), among the plurality of wiring layers, the slit W11a may be provided in one of the plurality of wiring layers (the first metal layer or the second metal layer as described above, for example). Further, lines (the source lines that are not illustrated, for example) that are formed by the third metal layer and that are electrically connected to the source lines S, may be used as the lines W32.

Further, in the folding portion 7, the first inorganic layer 31 and the second inorganic layer 33 are partitioned, on either side of the bulging portion 25a, along the direction in which the folding portion 7 extends (in other words, along the direction in which the bulging portion 25a extends). Thus, in the folding portion 7, the first inorganic layer 31 has a slit 31a, along the direction in which the folding portion 7 extends. Further, in the folding portion 7, the second inorganic layer 33 has a slit 33a, along the direction in which the folding portion 7 extends. The edges of the first inorganic layer 31 and the edges of the second inorganic layer 33 are respectively positioned between the organic layer 32 and the bulging portion 25b.

In the present embodiment, as described above, the inorganic insulating layer that is formed across the display units 5 and 5' and that covers the above-described slit 23 is not provided on the slit 23a, and the lines W31 cannot be formed over a region between the display units 5 and 5'. As a result, only the lines W32 formed by the third metal layer can be formed as the lines joining the display units 5 and 5', and when the lines W32 are formed over the region between the display units 5 and 5', the lines W32 that join the display units 5 and 5' are exposed.

Here, as described above, inside the bulging portion 25b, the lines W32 are led around to the lines W11 of the layer that is lower than the lines W32, and it is thus possible to inhibit the lines W32 from being the exposed lines.

Note that, in the present embodiment, the example is given of the case in which, in the slit 23a (more specifically, the folding portion 7), as well as providing, under the bulging portion 25b, the recessed portions whose bottom face is the resin layer 11b, in the barrier layer 11c, the gate insulating film 14, the lines W11, and the inorganic insulating films 15 and 16, the recessed portions penetrating the barrier layer 11c, the gate insulating film 14, the lines W11, and the inorganic insulating films 15 and 16, and having the respective slits 11cA, 14a, W11a, 15a, and 16a as the inner wall faces thereof, the edges of the first organic layer 31 and the second organic layer 33 are positioned, respectively, between the organic layer 32 and the bulging portion 25b.

However, the present embodiment is not limited thereto, and the inorganic layer (at least one of the barrier layer 11c, the gate insulating film 14, the lines W11, and the inorganic insulating films 15 and 16, for example) may be formed in island shapes on the above-described slit 23a.

Note that, when the island-shaped inorganic layer is formed on the slit 23a in this way, even in a case where cracks (fractures) are generated in the above-described inorganic layer as a result of folding the flexible display device 1, for example, the cracks do not reach the display units 5 and 5'.

Production Method of Flexible Display Device 1

Next, a production method of the above-described flexible display device 1 will be described below with reference to FIG. 6 to FIGS. 8A to 8C.

Figure 8A:
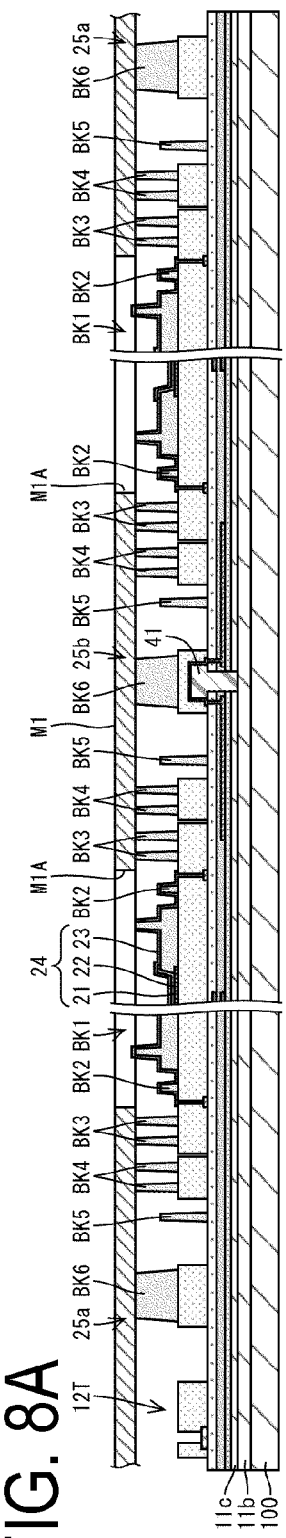
FIGS. 8A to 8C are cross-sectional views illustrating a sequence of processes of a production process of the main portions of the flexible display device according to the second embodiment of the disclosure.
Figure 8B:
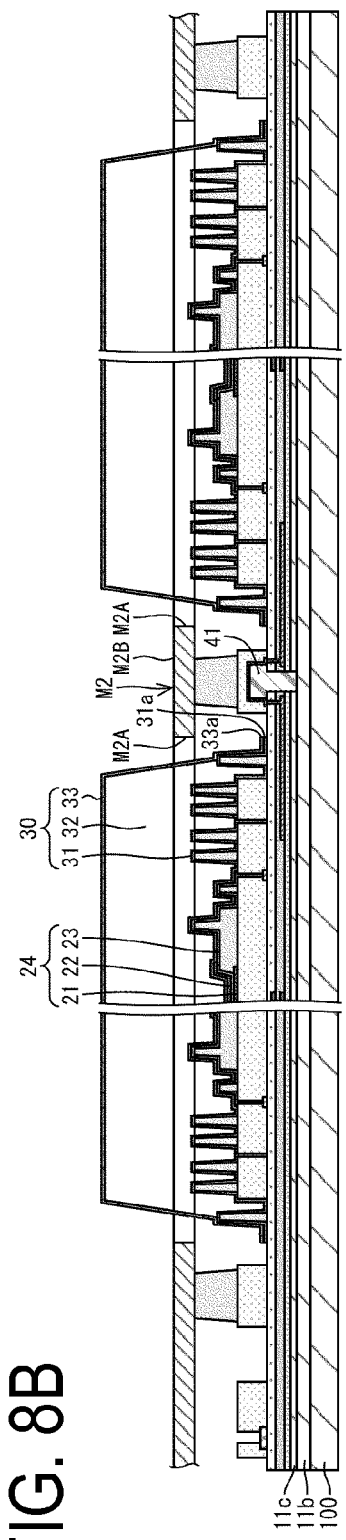
Figure 8C:
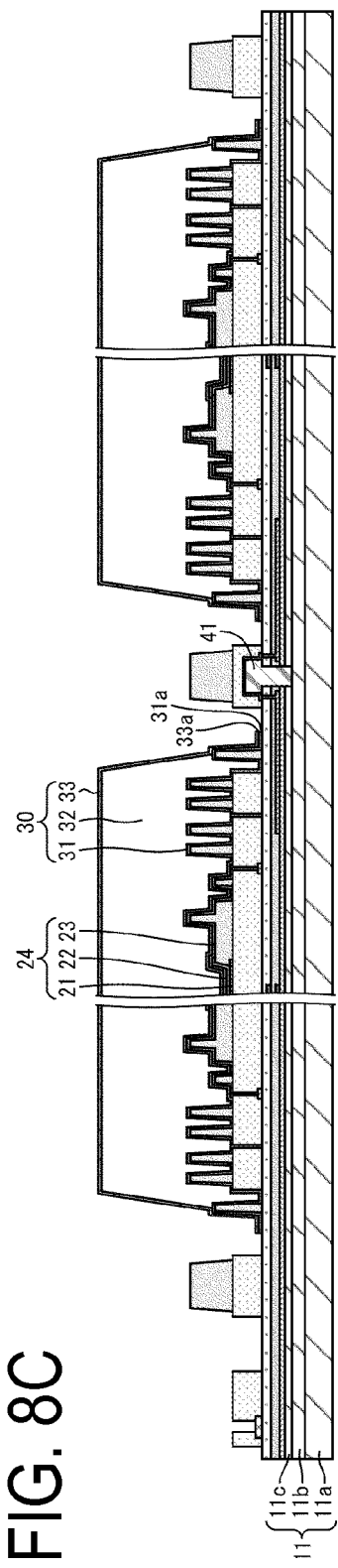

FIGS. 8A to 8C are cross-sectional views illustrating a sequence of processes of a production process of the main portions of the flexible display device 1 according to the present embodiment. Note that, in the production processes of the flexible display device 1 illustrated in FIG. 7, FIGS. 8A to 8C illustrate, respectively, a part of a cross section along a line E-E, a part of a cross section along a line D-D, and a cross section along a line F-F, aligned in order from the left in FIGS. 4A to 4C.

The flexible display device 1 according to the present embodiment can be produced in the same manner as the flexible display device 1 according to the first embodiment, except for the points described below.

In the present embodiment, as illustrated in FIGS. 6 to 8A, at the time of the film formation of the barrier layer 11c, the gate insulating film 14, the lines W11, and the inorganic insulating films 15 and 16, by performing patterning using photolithography or the like, the slits 11cA, 14a, W11a, 15a, and 16a are formed in the slit 23a.

Then, by the photolithography or the like, the resin layer 41 is formed so as to fill the above-described slits 11cA, 14a, W11a, 15a, and 16a, and after that, electrodes and lines formed by the third metal layer, including the lines W32 that cover the resin layer 41, are formed. Then, the organic insulating film 19 including the first organic insulating film pattern portions 19A and 19A', the second organic insulating film pattern portions 19B and 19B', the third organic insulating film pattern portion 19C, and the terminal portion organic insulating film pattern portion 19T, is formed such that the third organic insulating film pattern portion 19C covers the lines W32.

After that, similar to the first embodiment, the first electrode 21, the banks BK1 to BK6, and the second electrode 23 are formed.

At that time, similar to the first embodiment, as illustrated in FIG. 8A, in the vapor deposition of the second electrode 23, the vapor deposition is performed using, as the mask M1 for vapor deposition, the open mask having the opening M1A on the formation region of the second electrode 23, and, for example, the upper face of the bulging portion 25 and the upper faces of the banks BK3 and BK4 are used as the contact faces with the mask M1.

Note that, in FIG. 8A, similar to FIG. 6A, as an example of a vapor deposition process using the mask for vapor deposition, the example is illustrated of the vapor deposition process of the second electrode 23, but the present embodiment is not limited to this example. In the present embodiment also, the upper face of the bulging portion 25 and the upper faces of the bank portions BK1b, BK3 and BK4 may be used as the contact faces for the above-described mask when performing the selective vapor deposition to the light emitting layer, using the mask for vapor deposition having the opening corresponding to the pixels 3.

After that, the first inorganic layer 31 is formed in the same manner as in the first embodiment, apart from the fact that the first inorganic layer 31 is formed so as to have a slit 31a in the folding portion 7.

Next, after the organic layer 32 is formed in the same manner as in the first embodiment, the second inorganic layer 33 is formed in the same manner as in the first embodiment, apart from the fact that the second inorganic layer 33 is formed so as to have a slit 33a in the folding portion 7.

As illustrated in FIG. 8B, in the formation process of the above-described first inorganic layer 31 and formation process of the second inorganic layer 33, the upper face of the bulging portion 25, the upper face of the high bank portion BK1b, and the upper faces of the banks BK3 and BK4 can be used as the contact faces for a mask M2 for CVD, which has an opening M2A corresponding to the first inorganic layer 31 and the second inorganic layer 33.

According to the present embodiment, by providing the bulging portion 25b in the slit 23a (in particular, the folding portion 7), as described above, a support portion (the contact faces for the mask for CVD, a spacer), which supports the mask M2 for CVD, can be provided in the slit 23a (in particular, the folding portion 7). Even in a case where the bulging portion 25a is not formed, by providing the bulging portion 25a, a cross-piece portion M2B, which is a non-opening portion of the mask for CVD, can be provided along the folding portion 7. However, when the bulging portion 25b is not formed, the cross-piece portion M2B of the above-described mask M2 for CVD is deformed due to its own weight, there is a risk that the first inorganic layer 31 and the second inorganic layer 33 cannot be formed in a desired pattern.

According to the present embodiment, by providing the bulging portion 25b in the slit 23a (in particular, the folding portion 7), as described above, the slits 31a and 33a can be accurately formed in the slit 23a (in particular, the folding portion 7, see FIG. 6 and FIG. 7), using the mask M2 for CVD, as described above.

After that, similar to the first embodiment, by performing the adhesion of the temporarily attached film, the laser ablation, the adhesion of the lower face film 11a, the dicing of the OLED panel 2 into individual pieces, the peeling of the temporarily attached film, the adhesion of the functional film, and the like, the flexible display device 1 according to the present embodiment is produced.

Third Embodiment

Figure 9:
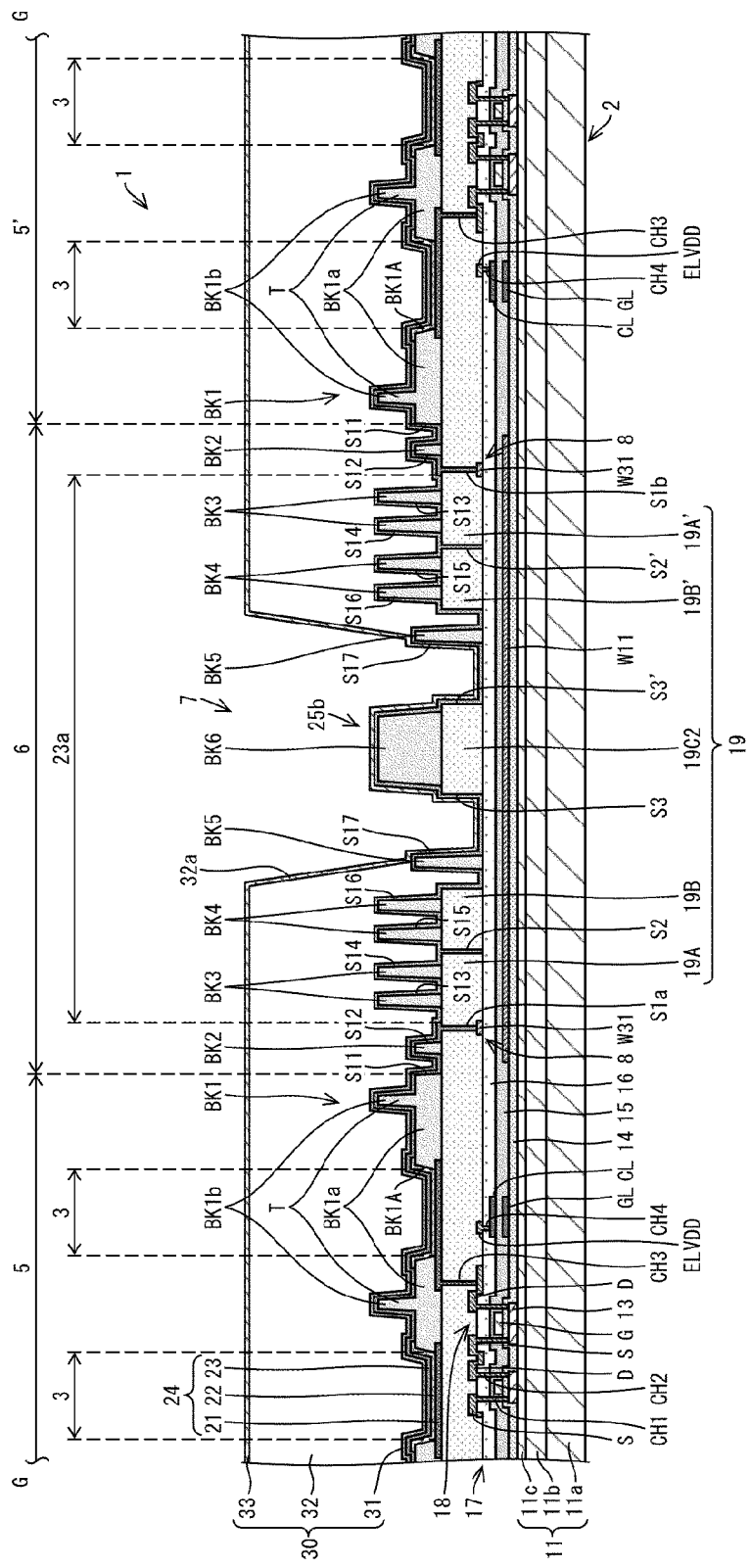
FIG. 9 is a cross-sectional view illustrating a schematic configuration around the folding portion of the flexible display device according to a third embodiment of the disclosure.
Figure 10:
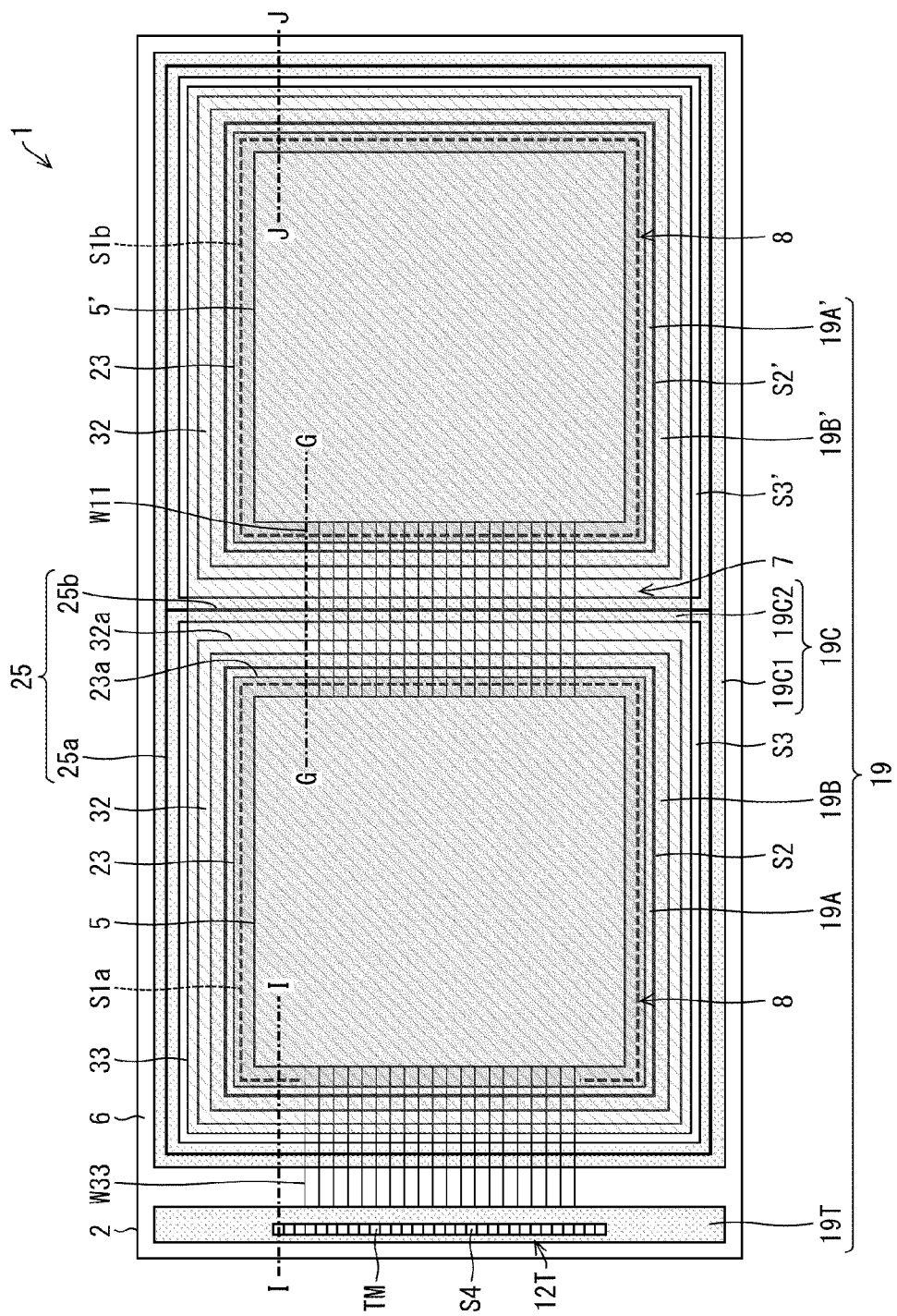
FIG. 10 is a plan view illustrating a schematic configuration of the main portions of the flexible display device according to the third embodiment of the disclosure.

A description follows regarding yet another embodiment of the disclosure, mainly with reference to FIG. 9 and FIG. 10. Note that, in the present embodiment, the differences with the first embodiment and the second embodiment will be described, members having the same function as the members described in the first and second embodiments will be assigned the same reference signs, and a description thereof will be omitted. Further, the same modifications as those of the first and second embodiments can also be applied to the present embodiment.

Schematic Configuration of Flexible Display Device 1

FIG. 9 is a cross-sectional view illustrating a schematic configuration around the folding portion 7 of the flexible display device 1 according to the present embodiment. FIG. 10 is a plan view illustrating a schematic configuration of the main portions of the flexible display device 1 according to the present embodiment. FIG. 9 corresponds to a cross-sectional view along a line G-G of the flexible display device 1 illustrated in FIG. 10. Note that, a cross-sectional view along a line I-I of the flexible display device 1 illustrated in FIG. 10 is the same as the cross-sectional view illustrated in FIG. 3, namely is the same as the cross-sectional view along the line B-B of the flexible display device 1 illustrated in FIG. 2. Further, a cross-sectional view along a line J-J of the flexible display device 1 illustrated in FIG. 10 is the same as the cross-sectional view illustrated in FIG. 4C and FIG. 8C. Thus, in the present embodiment, the cross-sectional views along the line I-I and along the line J-J of the flexible display device 1 illustrated in FIG. 10 are omitted.

The flexible display device 1 according to the present embodiment is, for example, the same as the flexible display device 1 according to the first embodiment, except for the points described below.

As illustrated in FIG. 9 and FIG. 10, in the flexible display device 1 according to the present embodiment, in a plan view, the slit S1a provided in the first organic insulating film pattern portion 19A is formed as a frame shape that surrounds the display unit 5, excluding a formation region (in other words, a part of the region between the terminal portion 12T and the display unit 5) of the plurality of lines W33, and is provided between the display unit 5 and the second electrode 23 along the edge portion of the second electrode 23, with a part (specifically, the above-described part of the region) thereof cut out.

Further, the slit S1b provided in the first organic insulating film pattern portion 19A' is formed in a frame shape surrounding the whole of the display unit 5' along the edge of the second electrode 23.

As a result, as illustrated in FIG. 10, in the flexible display device 1 according to the present embodiment, the slits S1a and S1b that configure the connecting portion between the second electrode 23 and the lines W31 (namely, the second electrode connecting portion 8) are formed across the whole region between the display units 5 and 5' (specifically, the whole of the region in a direction parallel to the folding portion 7 between the display units 5 and 5').

Thus, in contrast to the first and second embodiments, in which, in a plan view, the slits S1*a* and S1*b* between the display units 5 and 5' are only provided as far as a region preceding the formation region of the lines W11 while avoiding the formation region of the lines W11, in the present embodiment, in a plan view, the slits S1*a* and S1*b* between the display units 5 and 5' respectively intersect each of the lines W11, with the inorganic insulating film (the inorganic insulating films 15 and 16 in the example illustrated in FIG. 9) interposed therebetween.

In this way, similarly to the first embodiment, when the inorganic insulating layer is provided on the folding portion 7, by using, as the lines W11 that electrically connect the display units 5 and 5', the lines provided in a different plane (different layer) from the lines W31 that are electrically connected to the second electrode 23 with the inorganic insulating layer interposed therebetween, the second electrode connecting portion 8 can be formed across the whole of the display units 5 and 5'.

Thus, in the present embodiment, the lines formed by the third metal layer that are used as the lines W31 (the lines electrically connected to the source electrodes S, such as the source lines SL (not illustrated), for example) are not used as the lines W11, and the lines below those that are formed by the first metal layer (the lines electrically connected to the gate electrodes G, such as the gate lines GL, for example), or the lines formed by the second metal layer (the capacity wiring lines CL, for example) are used as the lines W11.

Production Method of Flexible Display Device 1

The flexible display device 1 according to the present embodiment can be produced in the same manner as the flexible display device 1 according to the first embodiment, except for the points described below.

In the present embodiment, in the first organic insulating film pattern portion 19A, the slit S1*a* is formed in the frame shape with the part thereof cut out, so as to surround the display unit 5 excluding the formation region of the lines W33, and in the first organic insulating film pattern portion 19A', the slit S1*b* is formed in the frame shape so as to surround the display unit 5'. Further, in the present embodiment, the lines W31 that are connected to each of the second electrodes 23 are formed so as to be exposed from each of the slits S1*a* and S1*b*. In this way, the flexible display device 1 according to the present embodiment is produced.

Fourth Embodiment

Figure 11:
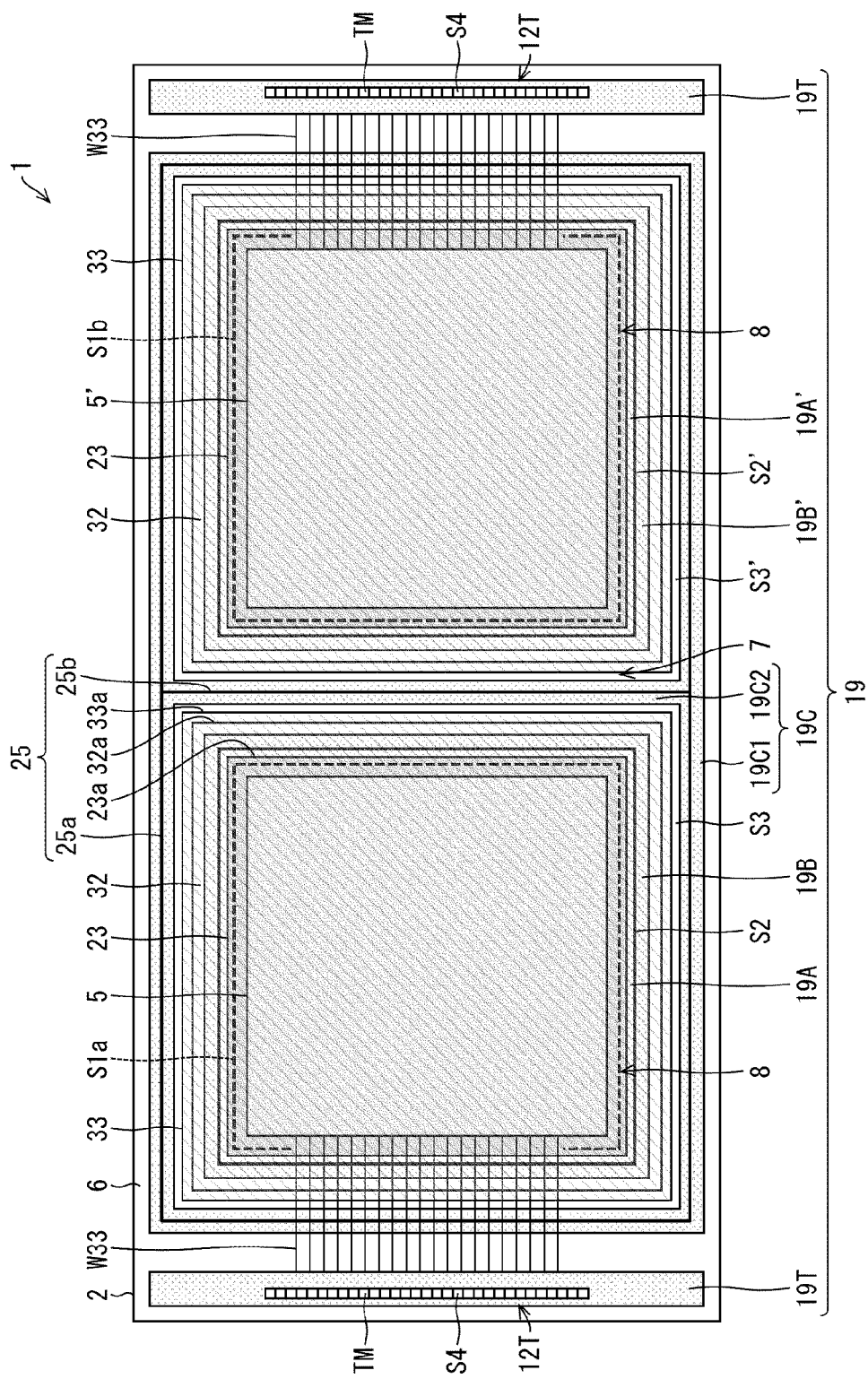
FIG. 11 is a cross-sectional view illustrating a schematic configuration around the folding portion of the flexible display device according to a fourth embodiment of the disclosure.

A description follows regarding yet another embodiment of the disclosure, mainly with reference to FIG. 11. Note that, in the present embodiment, the differences with the first to third embodiments will be described, members having the same function as the members described in the first to third embodiments will be assigned the same reference signs, and a description thereof will be omitted. Further, the same modifications as those of the first to third embodiments can also be applied to the present embodiment.

Schematic Configuration of Flexible Display Device 1

FIG. 11 is a plan view illustrating a schematic configuration of the main portions of the flexible display device 1 according to the present embodiment.

The flexible display device 1 according to the present embodiment is the same as the flexible display device 1 according to the first to third embodiments, except for the points described below.

As illustrated in FIG. 11, in the flexible display device 1 according to the present embodiment, the lines are not formed between the display units 5 and 5'. In other words, in the present embodiment, in the slits 23*a* of the second electrodes 23, slits are formed in each of the wiring layers (the first metal layer to the third metal layer). Thus, in the present embodiment, the display unit 5 and the terminal portion 12T for the lines provided on the display unit 5, and the display unit 5' and the terminal portion 12T for the lines provided on the display unit 5' are respectively provided on either side of the folding portion 7.

Specifically, in the present embodiment, in addition to providing the two display units 5 and 5' separately on either side of the folding portion 7, the two terminal portions 12T are also provided separately on either side of the folding portion 7 so as not to overlap with the folding portion 7.

As a result, the respective lines provided on each of the display units 5 and 5' are driven by different drivers.

Further, in the present embodiment, as well as providing the terminal portions 12T for each of the display units 5 and 5', by not providing the lines connecting the adjacent display units 5 and 5' in the slits 23*a* of the second electrodes 23 (more specifically, the folding portion 7), in a plan view, each of the second electrode connecting portions 8 (in other words, the slits S1*a*1 and S1*a*2 provided in the first organic insulating film pattern portion 19A) is formed as a frame shape that surrounds the display unit 5, excluding formation regions of the plurality of lines W33 (in other words, a part of the region between the display unit 5 and the terminal portion 12T for the lines provided on the display unit 5, and a part of the region between the display unit 5' and the terminal portion 12T for the lines provided on the display unit 5'), and is formed between the display unit 5 and the second electrode 23 along the edge portion of the second electrode 23, with a part (specifically, the above-described part of the region) thereof cut out.

Note that, in FIG. 11, an example is illustrated of a case in which the single bulging portion 25 is provided, but a plurality of the bulging portions 25 may be provided.

Further, in FIG. 11, the example is illustrated of the case in which each of the first inorganic layer 31 and the second inorganic layer 33 is partitioned at the slit 23*a* provided in the second electrode 23 (more specifically, in the folding portion 7), but as illustrated in FIG. 2 and FIG. 5, the first inorganic layer 31 and the second inorganic layer 33 may be formed so as to cross substantially the whole surface of the region surrounded by the bulging portion 25*a*.

Production Method of Flexible Display Device 1

The flexible display device 1 according to the present embodiment can be produced in the same manner as the flexible display device 1 according to the first to third embodiments, excepting that the two terminal portions 12T are provided in the slits 23*a* in place of forming the lines that electrically connect the plurality of display units 5 and 5'.

Supplement

In the flexible display device 1 according to a first aspect of the disclosure, the display units (the display units 5 and 5'), which include the plurality of light emitting elements (the organic EL elements 24), each of which includes the first electrode 21 provided for each of the pixels 3, the functional layer (the organic EL layer 22) that includes at least the light emitting layer, and the second electrode 23 provided in common for the plurality of pixels 3, are provided on either side of the folding portion 7. The semiconductor layer 13, the layered film 17 which includes the plurality of inorganic insulating layers (the gate insulating film 14, the inorganic insulating films 15 and 16, for example) and in which the plurality of inorganic insulating layers and the wiring layers are repeatedly layered, the flattening film (the organic insulating film 19) that levels the surface of the layered film 17, the banks BK formed to respectively cover the plurality of first electrodes 21 provided for each of the pixels and the peripheral portions of the plurality of first electrodes 21, the functional layer, the second electrode 23, and the sealing film 30 that is larger, in a plan view, than the second electrode 23 and that seals the plurality of light emitting elements are layered, in this order. The sealing film 30 includes the inorganic sealing layer (the first inorganic layer 31, the second inorganic layer 33, for example) and the organic sealing layer (the organic layer 32), and the second electrode 23 has the slit 23a, in the folding portion 7, that partitions the second electrode 23 between the plurality of display units (the display units 5 and 5'). In a plan view, inside the slit 23a of the second electrode 23 in the folding portion 7, at least one of the flattening film, the banks BK, and the organic sealing layer has the slit (the slits S3 and S3' of the flattening film, the slit S17 of the banks BK, the slit 32a of the organic sealing layer, for example), and the bulging portion 25 is provided that is formed by the flattening film and the banks BK and that surrounds each of the second electrodes 23 partitioned by the slit 23a provided in the second electrode 23.

In the flexible display device 1 according to a second aspect of the disclosure, with respect to the first aspect, in a plan view, the edge of the organic sealing layer may be positioned between the second electrode 23 and the bulging portion 25, and may be covered by the inorganic sealing layer.

In the flexible display device 1 according to a third aspect of the disclosure, with respect to the first or second aspect, in a plan view, the edge of the inorganic sealing layer may be positioned between the organic sealing layer and the bulging portion 25.

In the flexible display device 1 according to a fourth aspect of the disclosure, with respect to the third aspect, in a plan view, inside the slit 23a of the second electrode 23 in the folding portion 7, at least one layer of the inorganic insulating layer (the gate insulating film 14, the inorganic insulating layers 15 and 16, for example), at least one layer of the wiring layers (the wiring layer including the lines W11, or all of the wiring layers, for example), and the inorganic sealing layer (the first inorganic insulating layer 31, the second inorganic insulating layer 33, for example), may each have the slit (the slits 14a, 15a, 16a, W11a, 31a, 33a, for example).

In the flexible display device 1 according to a fifth aspect of the disclosure, with respect to any one of the first to fourth aspects, the flattening film and the banks BK may each have the slit (the slits S1a, S1b, S12) that exposes the part of the wiring layer (the lines W31), between the plurality of display units 5 and 5', and the second electrode 23 may be electrically connected to the part of the wiring layer via the slit provided in the flattening film and the banks BK.

In the flexible display device 1 according to a sixth aspect of the disclosure, with respect to any one of the first to fifth aspects, the wiring layer may include the lines (the lines W11, W32, for example) that electrically connect the plurality of display units 5 and 5', and, in a plan view, the lines may be provided inside the slit 23a of the second electrode 23 in the folding portion 7, and may intersect the bulging portion 25 (the bulging portion 25b of the bulging portion 25) inside the slit 23a of the second electrode 23 in the folding portion 7.

In the flexible display device 1 according to a seventh aspect of the disclosure, with respect to the fourth aspect, the wiring layer may include the lines (the lines W32) that electrically connect the plurality of display units 5 and 5', and, in a plan view, the lines (the lines W32) may be provided inside the slit 23a of the second electrode 23 in the folding portion 7. At the same time, below the lines (the lines W32), the organic layer (the resin layer 41) may be provided in the interior of the slit (the slits 14a, 15a, and 16a, for example) provided in the inorganic insulating layer (the gate insulating film 14, the inorganic insulating films 15 and 16, for example) that is the lower layer than the lines (the lines W32), and in the interior of the slit (the slit SW11a, for example) provided in at least one of the plurality of wiring layers (the wiring layer including the lines W11, for example) that is the lower layer than the lines.

In the flexible display device 1 according to an eighth aspect of the disclosure, with respect to the seventh aspect, in a plan view, inside the bulging portion 25 (the bulging portion 25b of the bulging portion 25) provided inside the slit 23a of the second electrode 23 in the folding portion 7, the lines (the lines W32) may be electrically connected to the part (the wires W11) of the wiring layer that is the lower layer than the lines (the lines W32).

In the flexible display device 1 according to a ninth aspect of the disclosure, with respect to the fifth aspect, the slit (the slits S1a, S1b, and S12) provided in the flattening film and the banks BK that exposes the part (the wires W31) of the wiring layer may be provided across a region between the adjacent display units 5 and 5'. In a plan view, the lines (the lines W11) that electrically connect the plurality of display units 5 and 5' may be provided inside the slit 23a of the second electrode 23 in the folding portion 7, and the lines (the lines W11) provided inside the slit 23a of the second electrode 23 may be provided in the wiring layer that is the lower layer than the wiring layer (the wiring layer including the lines W31) of which the part is exposed by the slit (the slits S1a, S1b, and S12) provided in the flattening film and the banks BK, via the inorganic insulating layer (the inorganic insulating films 15 and 16, for example).

In the flexible display device 1 according to a tenth aspect of the disclosure, with respect to any one of the first to ninth aspects, the banks BK may include an organic layer stopper formed by the frame-shaped banks (the banks BK5), which are partitioned by the plurality of slits (the slits S16 and S17) provided between the second electrode 23 and the bulging portion 25 and which surround each of the second electrodes 23 partitioned by the slit 23a provided in the second electrode 23, and the edge of the organic sealing layer may overlap with the organic layer stopper.

In the flexible display device 1 according to an eleventh aspect of the disclosure, with respect to any one of the first to tenth aspects, the terminal portion 12T on which the terminals of each of the lines in the plurality of wiring layers are formed may be provided so as not to overlap with the folding portion 7.

In the flexible display device 1 according to a twelfth aspect, with respect to any one of the first to eleventh aspects, in a plan view, on the inside of the bulging portion 25, the flattening film may have the slits (the slits S3 and S3') provided in contact with the bulging portion 25, along the bulging portion 25 and surrounding each of the second electrodes 23 partitioned by the slit 23a provided in the second electrode 23. Between the slits (the slits S3 and S3') provided in contact with the bulging portion 25 and the second electrode 23, the flattening film may further include the slits (the slits S2 and S2') that surround each of the second electrodes 23 partitioned by the slit 23a provided in the second electrode 23.

In the flexible display device 1 according to a thirteenth aspect of the disclosure, with respect to any one of the first to twelfth aspects, the height of the bulging portion 25 (the height H3) may be the same height as the height H1 of the portion, inside the plurality of display units 5 and 5', at which the total of the heights of the flattening film and the banks BK is the maximum height. In other words, the height H3 of the bulging portion 25 may not be higher than the height H1, and may be the same as or lower than the height H1.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Flexible display device
2 OLED panel
3 Pixel
5 Display unit
6 Frame region
7 Folding portion
8 Second electrode connecting portion
10 TFT substrate (support body)
11 Support body
11a Lower face film
11b Resin layer
11c Barrier layer
11cA, 14a, 15a, 16a, 23a, 31a, 32a, 33a, W11a S1a1, S1a2, S1a, S1b, S2, S2', S3, S3', S4, S11, S12, S13, S14, S15, S16, S17 Slit
12 TFT layer
12T Terminal portion
13 Semiconductor layer
14 Gate insulating film (inorganic insulating layer)
15, 16 Inorganic insulating film (inorganic insulating layer)
17 Layered film (layered film formed by repeatedly layering inorganic insulating layers and wiring layers)
18 TFT
19 Organic insulating film
19A First organic insulating film pattern portion
19B Second organic insulating film pattern portion
19C Third organic insulating film pattern portion
19C1 Frame portion
19C2 Cross-piece portion
19T Terminal portion organic insulating film pattern portion
20 OLED
21 First electrode
22 Organic EL layer
23 Second electrode
24 Organic EL element (light emitting element)
25, 25a, 25b Bulging portion
30 Sealing film
31 First inorganic layer
32 Organic layer
33 Second inorganic layer
BK, BK1, BK2, BK3, BK4, BK5, BK6 Bank
BK1a Low bank portion
BK1b High bank portion
GL Gate line (line)
SL Source line
W11, W31, W32 Line
TM Terminal

The invention claimed is:

1. A flexible display device comprising:
a plurality of displays provided on either side of a folding portion, each of the plurality of displays including a plurality of light emitting elements, each of the plurality of light emitting elements including (i) a first electrode provided for each of a plurality of pixels, (ii) a functional layer including at least a light emitting layer, and (iii) a second electrode provided in common for the plurality of light emitting elements, wherein
(i) a semiconductor layer, (ii) a layered film, which includes a plurality of inorganic insulating layers and a plurality of wiring layers and in which the inorganic insulating layers and the wiring layers are repeatedly layered, (iii) a flattening film that levels a surface of the layered film, (iv) a bank that respectively covers the plurality of first electrodes provided for each of the plurality of pixels and peripheral portions of the plurality of first electrodes, (v) the functional layer, (vi) the second electrode, and (vii) a sealing film which is larger, in a plan view, than the second electrode and which seals the plurality of light emitting elements, are layered in this order,
the sealing film includes an inorganic sealing layer and an organic sealing layer,
the second electrode includes a slit in the folding portion that partitions the second electrode between the plurality of displays,
in the plan view, inside the slit of the second electrode in the folding portion, the organic sealing layer includes a slit,
a bulging portion is defined by the flattening film and the bank, the bulging portion surrounds each of the second electrodes partitioned by the slit provided in the second electrode,
the bulging portion is provided between adjacent ones of the plurality of displays and positioned separately from the adjacent ones of the plurality of displays,
a first clearance gap is provided between the bulging portion and the inorganic sealing layer on a first one of the adjacent ones of the plurality of displays,
a second clearance gap is provided between the bulging portion and the inorganic sealing layer on a second one of the adjacent ones of the plurality of displays, and
the first clearance gap and the second clearance gap are in the folding portion such that any contact between the bulging portion and portions of the organic sealing layer included in both of the first one of the adjacent ones of the plurality of displays and the second one of the adjacent ones of the plurality of displays is avoided.

2. The flexible display device according to claim 1, wherein, in the plan view, an edge of the inorganic sealing layer is positioned between the organic sealing layer and the bulging portion.

3. The flexible display device according to claim 2, wherein, in the plan view, inside the slit of the second electrode in the folding portion, an inorganic insulating layer includes a slit, at least one of the plurality of wiring layers includes a slit, and the inorganic sealing layer includes a slit.

4. The flexible display device according to claim 3, wherein the at least one of the plurality of wiring layers includes lines that electrically connect the plurality of displays, in the plan view, the lines are provided inside the slit of the second electrode in the folding portion, and an organic layer is provided in an interior of the slit provided in the inorganic insulating layer being a lower layer than the lines, and in an interior of a slit provided in another of the plurality of wiring layers below the lines.

5. The flexible display device according to claim 4, wherein, in the plan view, inside the bulging portion provided inside the slit of the second electrode in the folding portion, the lines are electrically connected to a portion of the another of the plurality of wiring layers that is below the lines.

6. The flexible display device according to claim 1, wherein the flattening film and the bank each include slits that expose a portion of a first one of the plurality of wiring layers between the plurality of displays, and the second electrode is electrically connected to the portion of the first one of the plurality of wiring layers via the slits provided in the flattening film and the bank.

7. The flexible display device according to claim 6, wherein the slits provided in the flattening film and the bank that exposes the portion of the first one of the plurality of wiring layers are provided across a region between the adjacent ones of the plurality of displays, in the plan view, lines that electrically connect the plurality of displays are provided inside the slit of the second electrode in the folding portion, and the lines are provided in a second one of the plurality of wiring layers that is below the first one of the plurality of wiring layers.

8. The flexible display device according to claim 1, wherein, in the plan view, an edge of the organic sealing layer is positioned between the second electrode and the bulging portion, and is covered by the inorganic sealing layer.

9. The flexible display device according to claim 1, wherein one of the plurality of wiring layers includes lines that electrically connect the plurality of displays, and in the plan view, the lines are provided inside the slit of the second electrode in the folding portion, and intersect the bulging portion inside the slit of the second electrode in the folding portion.

10. The flexible display device according to claim 1, wherein the bank includes an organic layer stopper defined by frame-shaped banks, which are partitioned by a plurality of gaps provided between the second electrode and the bulging portion and which surround each of the second electrodes partitioned by the slit provided in the second electrode, and an edge of the organic sealing layer overlaps with the organic layer stopper.

11. The flexible display device according to claim 1, wherein a terminal portion on which terminals of each of lines in the plurality of wiring layers are defined does not overlap with the folding portion.

12. The flexible display device according to claim 1, wherein in the plan view, inside a circumference of the bulging portion, the flattening film includes a slit provided in contact with the bulging portion, along the bulging portion and surrounding each of the second electrodes partitioned by the slit provided in the second electrode, and inside a circumference of the slit provided in contact with the bulging portion, the flattening film further includes slits that surround each of the second electrodes partitioned by the slit provided in the second electrode.

13. The flexible display device according to claim 1, wherein a height of the bulging portion is not greater than a height of a portion, inside the plurality of displays, of a total of heights of the flattening film and the bank.

14. A flexible display device comprising:

a plurality of displays provided on either side of a folding portion, each of the plurality of displays including a plurality of light emitting elements, each of the plurality of light emitting elements including (i) a first electrode provided for each of a plurality of pixels, (ii) a functional layer including at least a light emitting layer, and (iii) a second electrode provided in common for the plurality of light emitting elements, wherein (i) a semiconductor layer, (ii) a layered film, which includes a plurality of inorganic insulating layers and a plurality of wiring layers and in which the inorganic insulating layers and the wiring layers are repeatedly layered, (iii) a flattening film that levels a surface of the layered film, (iv) a bank that respectively covers the plurality of first electrodes provided for each of the plurality of pixels and peripheral portions of the plurality of first electrodes, (v) the functional layer, (vi) the second electrode, and (vii) a sealing film which is larger, in a plan view, than the second electrode and which seals the plurality of light emitting elements, are layered in this order, the sealing film includes an inorganic sealing layer and an organic sealing layer, the second electrode includes a slit in the folding portion that partitions the second electrode between the plurality of displays, in the plan view, inside the slit of the second electrode in the folding portion, the organic sealing layer includes a slit, a bulging portion is defined by the flattening film and the bank, the bulging portion surrounds each of the second electrodes partitioned by the slit provided in the second electrode, in the plan view, an edge of the inorganic sealing layer is positioned between the organic sealing layer and the bulging portion, in the plan view, inside the slit of the second electrode in the folding portion, an inorganic insulating layer includes a slit, at least one of the plurality of wiring layers includes a slit, and the inorganic sealing layer includes a slit, the at least one of the plurality of wiring layers includes first lines that electrically connect the plurality of displays, in the plan view, the first lines are provided inside the slit of the second electrode in the folding portion, and an organic layer is provided in an interior of the slit provided in the inorganic insulating layer being a lower layer than the first lines, and in an interior of a slit provided in another of the plurality of wiring layers that is below the first lines.

15. The flexible display device according to claim 14, wherein
the flattening film and the bank each include slits that expose a portion of a first one of the plurality of wiring layers between the plurality of displays, and
the second electrode is electrically connected to the portion of the first one of the plurality of wiring layers via the slits provided in the flattening film and the bank.

16. The flexible display device according to claim 15, wherein
the slits provided in the flattening film and the bank that exposes the portion of the first one of the plurality of wiring layers are provided across a region between adjacent ones of the plurality of displays,
in the plan view, second lines that electrically connect the plurality of displays are provided inside the slit of the second electrode in the folding portion, and
the second lines are provided in a second one of the plurality of wiring layers that is below the first one of the plurality of wiring layers.

17. The flexible display device according to claim 14, wherein, in the plan view, an edge of the organic sealing layer is positioned between the second electrode and the bulging portion, and is covered by the inorganic sealing layer.

18. The flexible display device according to claim 14, wherein
in the plan view, the first lines are provided inside the slit of the second electrode in the folding portion and intersect the bulging portion inside the slit of the second electrode in the folding portion.

19. The flexible display device according to claim 14, wherein, in the plan view, inside the bulging portion provided inside the slit of the second electrode in the folding portion, the first lines are electrically connected to a portion of the another of the plurality of wiring layers that is below the first lines.

20. A flexible display device comprising:
a plurality of displays provided on either side of a folding portion, each of the plurality of displays including a plurality of light emitting elements, each of the plurality of light emitting elements including (i) a first electrode provided for each of a plurality of pixels, (ii) a functional layer including at least a light emitting layer, and (iii) a second electrode provided in common for the plurality of light emitting elements, wherein
(i) a semiconductor layer, (ii) a layered film, which includes a plurality of inorganic insulating layers and a plurality of wiring layers and in which the inorganic insulating layers and the wiring layers are repeatedly layered, (iii) a flattening film that levels a surface of the layered film, (iv) a bank that respectively covers the plurality of first electrodes provided for each of the plurality of pixels and peripheral portions of the plurality of first electrodes, (v) the functional layer, (vi) the second electrode, and (vii) a sealing film which is larger, in a plan view, than the second electrode and which seals the plurality of light emitting elements, are layered in this order,
the sealing film includes an inorganic sealing layer and an organic sealing layer,
the second electrode includes a slit in the folding portion that partitions the second electrode between the plurality of displays,
in the plan view, inside the slit of the second electrode in the folding portion, the organic sealing layer includes a slit,
a bulging portion is defined by the flattening film and the bank, the bulging portion surrounds each of the second electrodes partitioned by the slit provided in the second electrode,
the bank includes an organic layer stopper defined by frame-shaped banks, which are partitioned by a plurality of gaps provided between the second electrode and the bulging portion and which surround each of the second electrodes partitioned by the slit provided in the second electrode, and
an edge of the organic sealing layer overlaps with the organic layer stopper.

* * * * *